(12) United States Patent
Ovshinsky et al.

(10) Patent No.: US 6,671,710 B2
(45) Date of Patent: Dec. 30, 2003

(54) METHODS OF COMPUTING WITH DIGITAL MULTISTATE PHASE CHANGE MATERIALS

(75) Inventors: Stanford R. Ovshinsky, Bloomfield, MI (US); Alastair K. Livesey, Bloomfield Hills, MI (US)

(73) Assignee: Energy Conversion Devices, Inc., Rochester Hills, MI (US)

(*) Notice: Subject to any disclaimer, the term of this patent is extended or adjusted under 35 U.S.C. 154(b) by 61 days.

(21) Appl. No.: 10/144,319

(22) Filed: May 10, 2002

(65) Prior Publication Data

US 2003/0212724 A1 Nov. 13, 2003

(51) Int. Cl.⁷ .............................. G06F 7/00
(52) U.S. Cl. ........................ 708/493; 365/163
(58) Field of Search ................ 708/490, 493; 365/163, 185.03, 185.12; 257/2, 3, 4

(56) References Cited

U.S. PATENT DOCUMENTS

| 5,825,046 A | * 10/1998 | Czubatyj et al. ........... 257/2 |
| 5,912,839 A | 6/1999 | Ovshinsky et al. |
| 6,141,241 A | 10/2000 | Ovshinsky et al. |

* cited by examiner

*Primary Examiner*—Chuong Dinh Ngo
(74) *Attorney, Agent, or Firm*—Kevin L. Bray; Marvin S. Siskind

(57) ABSTRACT

Non-binary methods of computing utilizing a digital multistate phase change material. Addition, subtraction, multiplication, and division are accomplished with the controlled application of energy to a phase change material. In one embodiment, energy in an amount insufficient to set the reset state of a phase change material is provided to store one or more numbers and further energy characteristic of the performance of a mathematical operation is provided to effect a computation. The set energy of the reset state of a phase change material provides an interval of energy that may be used to define programming states along the high resistance portion of the electrical resistance response curve of a phase change material. By sub-dividing this interval of energy, a plurality of programming states can be defined which are distinguishable in energy relative to the reset state. Numerical values can be assigned to the programming states and computations in non-binary arithmetic bases can be completed by providing energy to effect controlled transformations between programming states.

67 Claims, 13 Drawing Sheets

BASIC ADD (a+b;a,b)

RESET (a)

RESET (a)

HALFCOPY_1 (b;a)

COPY_1 (b,c;a)

BASIC ADD (a+b;a,b)

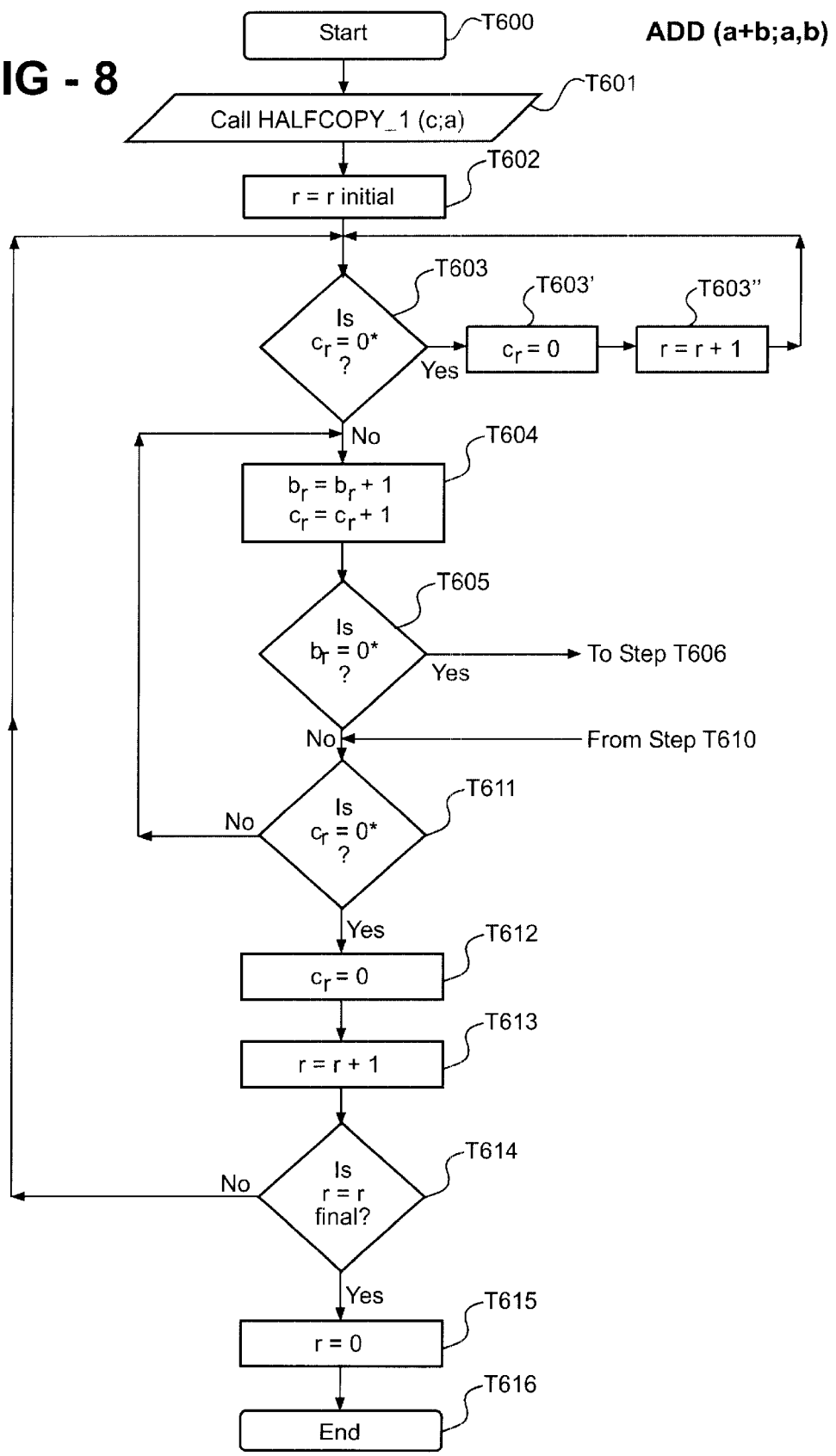

ADD (a+b;a,b)

SUBTRACT (b-a;a,b)

BASIC MULTIPLY (ab;a,b)

BASIC DIVIDE (b/a;a,b)

METHODS OF COMPUTING WITH DIGITAL MULTISTATE PHASE CHANGE MATERIALS

FIELD OF THE INVENTION

The instant invention pertains generally to non-binary methods of computing and more particularly to methods for addition, subtraction, multiplication and division that utilize the digital multistate properties of phase change materials.

BACKGROUND OF THE INVENTION

The development of the computer is commonly regarded as one of the most significant advances of the last half of the twentieth century. Computers have simplified many aspects of everyday life and have led to significant productivity gains in the economy. Recent needs in image processing and complex computing have spurned significant advances in microprocessor speed and memory storage density. Further advances and future applications of computers depend on mankind's ability to process larger amounts of information in increasingly more efficient ways.

Silicon is at the heart of today's computer. The advances in computing power and speed have largely been a consequence of better understanding the fundamental properties of silicon and harnessing those properties for practical effect. Initial progress was predicated on building basic electronic components such as transistors and diodes out of silicon and later progress followed from the development of integrated circuits. Recent advances represent a continuation of these trends and currently emphasize miniaturization and the integration of an ever larger number of microelectronic devices on a single chip. Smaller devices lead to higher memory storage densities, more highly integrated circuits and reduced interaction times between devices on the same chip.

The current strategy for improving processing speed and storage density depends on an ability to continue to miniaturize silicon based microelectronic devices. To date, miniaturization has approximately followed Moore's Law. According to Moore's Law, the number of transistors that can be integrated on a chip of a given size is expected to double every 18 months. Moore's Law has proven to be a remarkably reliable predictor of progress over the last 25 years and we are currently at the point where chips contain tens of millions of transistors, each of which measures about 0.2 micron across.

The question for the future is whether miniaturization efforts can continue indefinitely or whether practical or fundamental physical limits will present insurmountable barriers to miniaturization. Significant practical limitations include crosstalk between devices on a chip and difficulties in further reducing the size of devices. Crosstalk corresponds to the leakage of current or charge from one device to neighboring devices. Ideally, all devices on a chip interact along predetermined interconnects defined by the logic or ultimately intended purpose of the chip. As miniaturization proceeds, however, the spaces between devices necessarily decreases and undesired interactions between devices becomes increasingly problematic as electric fields, charge or current from one device affect other devices by virtue of close spatial proximity rather than through patterned interconnects. Crosstalk interferes with the intended function of a chip.

The size of microelectronic devices that can be assembled on a chip is primarily a function of the lithography process used to pattern the devices. Lithography is a process of exposing a photoresist material to light. The dimensions of the photoresist material exposed to light are directly related to the dimensions of the ultimate devices formed on the chip. The wavelength of light used in lithography controls the dimensions of the photoresist material exposed to light. The shorter the wavelength of light used, the higher the resolution of the lithography process and the smaller the dimensions of the ultimate devices formed.

In principle, the practical limitations represented by crosstalk and lithographic resolution can be overcome. Crosstalk, for example, may be overcome by incorporating insulating layers with lower dielectric constants than are currently used in the transistor structure. Lithographic resolution can be improved by developing shorter wavelength light sources such as, for example, the excimer laser. Although these solutions, and others that have been proposed, are potentially possible; they are accompanied by tremendous increases in production costs. The cost of building a chip manufacturing facility has increased from less than $5 million to more than $1.5 billion over the past 25 years. Costs are expected to continue to escalate rapidly in the future and are currently becoming sufficiently severe that further improvements in chips may no longer be economically justifiable. The computer industry is at a crossroads.

In order for the computer industry to expand and for the computer to become more than a commodity item, revolutionary changes are needed in the way computers work and in the materials used in the processing and memory elements. Improvements in computing speed and efficiency as well as greater parallelness are among the advances needed if the conventional computer is to evolve toward a more interactive and adaptable learning machine.

SUMMARY OF THE INVENTION

The instant invention provides methods of computing in a non-binary fashion that utilize the digital multistate properties of a phase change material. The digital multistate phase change material may be incorporated into memory elements or registers of computers and other data processing units that are capable of implementing the instant computing methods. The digital multistate phase change memory materials utilized by the instant computing methods have at least a high resistance state and a detectably distinct low resistance state. Methods and algorithms for resetting memory elements comprised of a digital multistate phase change material, defining programming states for the storage of numbers, moving the contents of one memory element to another memory element, computing the complement of a number, and executing the mathematical operations of addition, subtraction, multiplication and division using a digital multistate phase change material are disclosed herein.

Memory elements comprising a digital multistate phase change material may be organized into memory groups where each memory element within a group may be used to store one digit of a multidigit number. A memory element shall also be referred to herein as a register. A memory group thus corresponds to a collection of memory elements or registers. The number of memory elements or registers included in a memory group is variable and is generally determined by the maximum number of digits that one wishes to associate with numbers for the purposes of storage. The maximum number of digits that one associates with a number represents a tradeoff between precision and efficiency of manipulation.

Through the grouping of registers to form memory groups, the memory elements may be programmed to store multidigit numbers. Instead of being limited to operations based on a binary or base 2 arithmetic system, the digital multistate characteristic of the phase change material permits the storage and processing of digits associated with any arithmetic base in the registers to achieve non-binary computational capability. Direct storage and processing of numbers in base 10, base 8, or base 16, for example, is possible with the instant invention. Bases of hundreds, thousands or even higher are also compatible with the instant invention. As a result, the instant invention provides an opportunity to achieve massively parallel computation. The parallel computation capability, higher storage densities and non-binary operation possible with multistate memory elements through the instant computing methods provide an opportunity to vastly improve the speed and efficiency of computation relative to conventional computing machines.

Algorithms disclosed herein describe methods for storing and processing information using multistate memory elements comprising a phase change material. Included in the instant invention are methods directed at single register operation as well as register by register operations of multistate memory groups. In these methods, energy is applied to a single register or to individual registers within a memory group to store a digit or to alter the value of a digit that has previously been stored. These methods include provisions for addressing individual registers and provide methodologies for manipulating a group of registers, or relevant subset thereof, associated with one or more memory groups to achieve a desired mathematical operation or processing objective.

BRIEF DESCRIPTION OF THE DRAWINGS

FIG. 8 and FIG. 8A show steps in a method of adding denoted ADD. In this embodiment, the sum of numbers in locations a and b is provided.

DETAILED DESCRIPTION OF THE INVENTION

Figure 1:
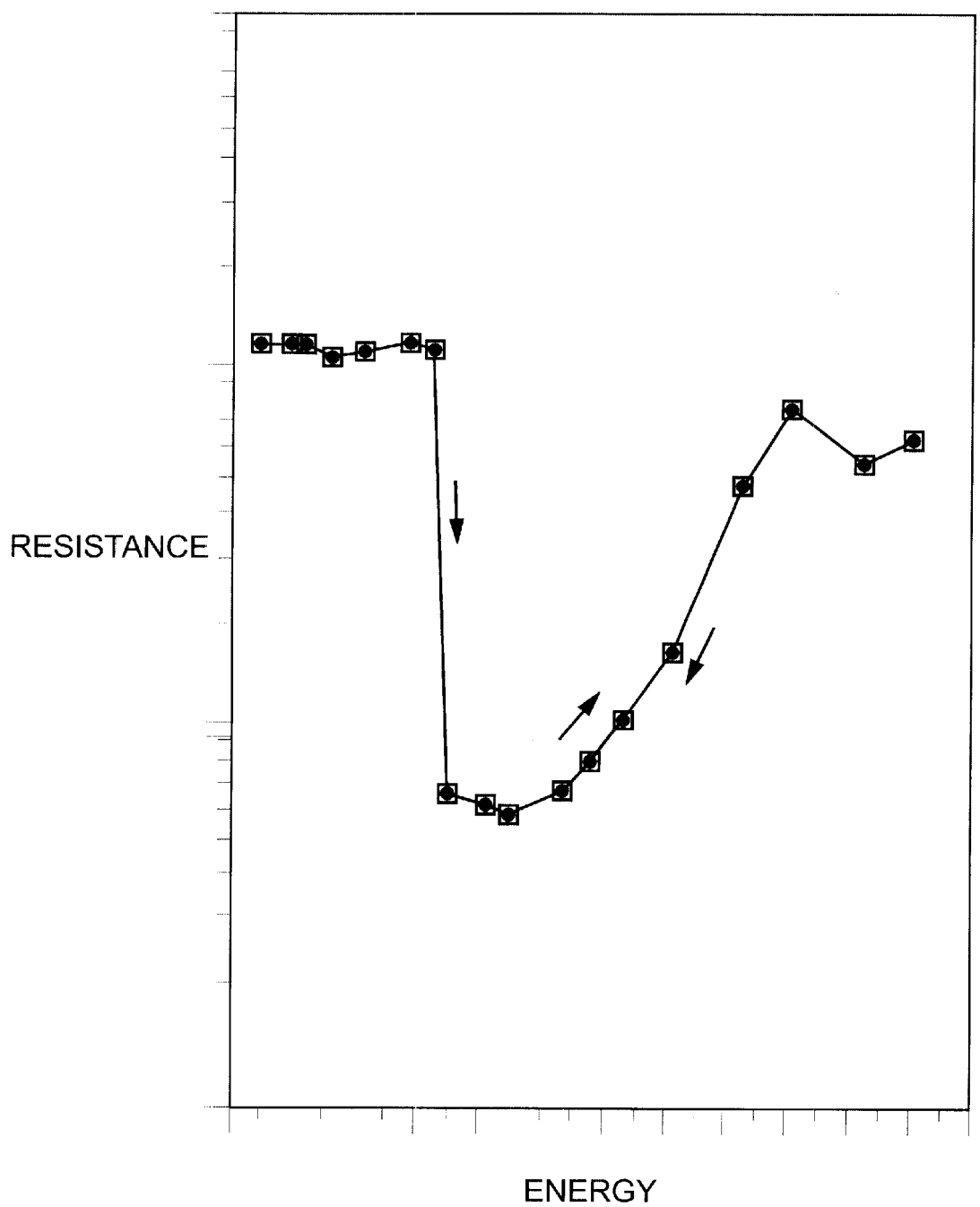
FIG. 1 is a plot of the electrical resistance of a representative phase change material as a function of the amount of energy provided. The plot includes a high resistance plateau region on the left and a post-setting region. Representative states in both regions are shown for illustration purposes.

The instant invention provides methods for computing and processing data that employ the digital multistate properties of a phase change material. The phase change material may be incorporated into memory groups, memory elements or registers of a computer or other data processing unit. As used herein, memory groups comprise a volume of phase change material that may be partitioned or sub-divided into memory elements where each memory element may be used to store one digit of a multidigit number. A memory element shall also be referred to herein as a register. A memory group thus corresponds to a collection of memory elements or registers. The number of memory elements or registers included in a memory group is variable and is generally determined by the maximum number of digits that one wishes to associate with numbers for the purposes of storage. The instant computing methods are directed at completing mathematical operations and data processing utilizing the digital multistate properties of a phase change material.

Whereas conventional computers and data processors rely on binary memory elements which store and process data using two states in the form of the binary "0" and "1" bits, the instant invention provides computing methods and algorithms for memory elements capable of adopting multiple states. Such memory elements may store more information in a given volume of memory material than is possible in binary computers. As a result, computers operating with the instant computing methods may offer much higher data storage capability than conventional computers. The instant methods also offer the capability of computing in a non-binary fashion. As a result, the writing, processing and reading of data may be achieved through non-binary methods thereby freeing us from the inherent limitations on conventional binary computing machines.

An intriguing development late in the twentieth century was the notion of quantum computing. A key potential advantage of quantum computing is an attainment of a massively parallel computational capability through the entanglement of a large number of superimposed states. This capability is widely touted as the solution for resolving the complexities associated with next generation computing and several groups have demonstrated initial progress in developing quantum computing algorithms, such as Shor's algorithm, for solving longstanding problems such as factorization of large numbers. The working models of quantum computers that have been devised to date, however, are temperamental and prone to failure in the face of seemingly inconsequential external disturbances. Consequently, the parallelism offered by quantum computers appears to be a long way from becoming a reality.

The instant computing methods utilizing digital multistate properties may provide an opportunity for achieving massively parallel computational capability analogous to that potentially achievable from quantum computers. The digital multistate characteristics of phase change materials acted on by the instant computing methods may be likened to the superposition of multiple states that is central to entanglement effects in the quantum computer. Unlike the quantum computer, however, the multistate phase change material and instant computing methods are robust and stable to a wide variety of external influences. The combination of high storage densities and multistate computational characteristics offered by the instant invention provide tremendous opportunities for achieving computational speeds and efficiencies that far exceed those of conventional computers.

Bit operations and algorithms for conventional binary memory materials may not be directly transferable to memory elements based on a digital multistate phase change material. These multistate memory elements require new algorithms for processing data and completing mathematical operations. Several methods and algorithms designed for multistate memory elements are disclosed herein. These methods are predicated on the interaction of energy with the memory elements according to the physical and chemical properties of the phase change material incorporated within the memory elements. The basic properties of the phase change material are reviewed hereinbelow and have been previously described in U.S. Pat. Nos. 5,912,839 and 6,141,241; the disclosures of which are hereby incorporated by reference.

The memory elements and registers on which the instant methods act are comprised of a phase change memory material having at least a high resistance state and a detectably distinct low resistance state. As used herein, high and low resistance states refer to physical states characterized by high and low electrical resistances, respectively, where the electrical resistances of the high and low electrical resistance states are relative to and detectably distinct from each other. Examples of the phase change memory materials used by methods of the instant invention are described in commonly assigned U.S. Pat. Nos. 5,166,758; 5,296,716; 5,524,711; 5,536,947; 5,596,522; 5,825,046; and 5,687,112; the disclosures of which are hereby incorporated by reference. Examples of memory elements to which the instant methods are directed are described in commonly assigned U.S. Pat. Nos. 5,912,839 and 6,141,241; the disclosures of which are also hereby incorporated by reference.

The phase change material to which the instant computing methods are directed used can be transformed from a high resistance state to a low resistance state upon the application of an effective amount of energy. FIG. 1 disclosed herein is a plot of the electrical resistance of a phase change material as a function of energy. The energy in the embodiment of FIG. 1 is electrical energy applied in the form of an electrical current pulse. If the phase change material is initially in its high resistance state, the application of small amounts of energy leaves the material in its high resistance state. This behavior is depicted by the high resistance plateau region shown on the left side of FIG. 1. If a sufficient amount of energy is applied, however, the phase change material transforms from its high resistance state to its low resistance state. This transformation is depicted by the steep reduction in electrical resistance immediately to the right of the high resistance plateau region of FIG. 1. This transformation of the phase change material from its high resistance state to its low resistance state is hereafter referred to as "setting" or "to set" the phase change material. The low resistance state produced upon setting is hereafter referred to as the "set state" of the phase change material. An amount of energy sufficient to set the phase change material is hereafter referred to as the "set energy" or "setting energy". Note that the set energy is different for each state along the high resistance plateau.

The right side of FIG. 1 corresponds to the behavior of the phase change material when it has been set. Once set, the phase change material is in its low resistance state and is influenced by the application of energy according to the post-setting region shown in right side of FIG. 1. This portion of the electrical resistance response curve has been referred to as the analog or greyscale multibit portion of the curve in several of the U.S. Patents incorporated by reference hereinabove. The application of energy to the post-setting state of the phase change material may produce changes in its electrical resistance. The change in electrical resistance is determined by the amount of energy applied. Depending on the applied energy and the state of the phase change material in the post-setting region of FIG. 1, an increase or decrease in electrical resistance may occur because the behavior in the post-setting region is reversible. This reversibility is depicted by the two arrows shown in the post-setting region of FIG. 1. An energy and electrical resistance is associated with each point in the post-setting region. If the applied energy exceeds the energy associated with the point describing a phase change material in the post-setting region, the electrical resistance of the phase change material increases. Conversely, if the applied energy is less than the energy associated with the point describing a phase change material in the post-setting region, the electrical resistance decreases. The reversibility is limited to the post-setting region of FIG. 1. It is not possible to reverse the setting transformation by applying an energy corresponding to a point in the high resistance plateau region of FIG. 1 that precedes (i.e. is to the left of) the setting transformation.

It is possible, however, to restore the high resistance state of the phase change material by applying a sufficiently high amount of energy to a material described by a point in the post-setting region of FIG. 1. The application of such energy corresponds to moving in the direction of increasing energy in FIG. 1, rather than in the direction of reversing the setting transformation. As shown in the post-setting region of FIG. 1, the application of continually increasing amounts energy leads to a continual increase in electrical resistance. Upon application of a sufficient amount of energy to drive the phase change material to the far right side of FIG. 1, the phase change material returns to its high resistance state and renews its high resistance plateau. The amount of energy needed to transform a phase change material from its low resistance set state to its high resistance state is hereafter referred to as the "reset energy" or "resetting energy". The state of the phase change material at the conclusion of the application of the reset energy is hereafter referred to as the "reset state". The application of the reset energy "resets" the phase change material to produce a high resistance reset state. The behavior observed upon further application of energy after resetting is analogous to that described for the high resistance plateau region of FIG. 1. The plot shown in FIG. 1 corresponds to one cycle of setting and resetting. The phase change material can be reproducibly set and reset over a large number of cycles.

The reversible behavior associated with the post-setting region of FIG. 1 forms the basis of analog, multi-bit gray scale devices that are programmable to specific electrical resistance values. Examples of such devices are described, for example, in U.S. Pat. No. 5,687,112 to Ovshinsky et al. and in U.S. Pat. Nos. 3,271,591 and 3,530,441 to Ovshinsky, the disclosures of which are hereby incorporated by reference.

The memory elements of the instant computer and the instant algorithms are based on phase change memory materials in the high resistance states represented by the plateau region depicted in the left side of FIG. 1. The states along the high resistance plateau are distinguished from states in the post-setting portion of the response curve in that they all have substantially identical electrical resistance values. By contrast, states in the post-setting region possess a continuously variable range of electrical resistance values. The high resistance plateau provides digital multistate storage and processing capability that can lead to faster and more versatile computers. The instant computing methods are directed at exploiting the advantages of the digital multistate high resistance plateau portion of the electrical response of phase change materials.

The multistate performance of the phase change material is a consequence of the properties of the high resistance states. The application of energy in an amount less than that needed to set, hereafter referred to as a "sub-setting amount of energy", to a phase change material in a high resistance state leads to a physical modification in the material that does not materially change its electrical resistance. The plateau region of FIG. 1 is characteristic of this property of the high resistance states. The application of a sub-setting amount of energy to a phase change material described by a first point in the plateau region of FIG. 1 transforms the phase change material to a physical state described by a second point in the plateau region where the second point is to the right of the first point. It is not possible to transform a phase change material in the leftward direction in the high resistance plateau region through the application of a sub-setting amount of energy. The concept of reversibility as described hereinabove for the post-setting, analog, multibit portion of FIG. 1 does not apply to the pre-setting, digital multistate high resistance plateau. A point to the left of an initial point in the high resistance plateau region may be reached by setting the phase change material, resetting it and then applying an appropriate sub-setting amount of energy.

As a consequence of the one-directional response in the high resistance plateau region, the phase change material acted on by the instant computing methods is able to accumulate and store energy in an amount up to the set energy of the material. Even though the electrical resistance of the phase change material does not change in the high resistance plateau region, each sub-setting application of energy causes the phase change material to predictably progress toward the low resistance set state. This behavior of the phase change material may be utilized in multistate memory elements and underlies the methods and algorithms disclosed herein.

In a preferred embodiment, the reset state is selected as the starting point within the high resistance plateau region of FIG. 1. The interval of energy required to transform a phase change material from its reset state to its set state is hereafter referred to as the "setting (or set) energy of the reset state". Since the setting energy of the reset state is a property that is reproducible and constant over multiple cycles of setting and resetting, it may be divided into two or more sub-intervals and different programming states or programming values of the phase change memory material may be defined by or associated with different numbers or combinations of sub-interval energy applications. The reproducible one-directional behavior of the phase change material in the high resistance plateau region of FIG. 1 provides an ability to establish distinct programming states according to the cumulative amount of energy applied to the material in sub-interval amounts. A set of distinct programming states can be uniquely and reproducibly defined by the cumulative amount of energy applied to the reset state by a sub-setting series of sub-interval applications of energy. A first programming state, for example, may be associated with the application of a first sub-interval amount of energy to the reset state. A second application of the first sub-interval amount of energy to the phase change material in the first programming state may be used to define a second programming state. A second programming state may alternatively be associated with a single application of a second sub-interval amount of energy, which differs in magnitude from the first sub-interval amount of energy, to the reset state. Sequential applications and combinations of sub-interval amounts of energy may be used to define a series of programming states throughout the high resistance plateau region of FIG. 1.

The plurality of sequences and combinations of sub-interval applications of energy constitute embodiments for establishing programming states that may be used by the instant computing methods. In some embodiments, only states within the high resistance plateau region are included as programming states. In other embodiments, the set state obtained upon transformation of the phase change material to its low resistance state is included as an additional programming state. When the cumulative amount of energy applied to the reset state reaches the setting energy of the reset state, the phase change material sets. After setting, the behavior of the phase change material upon further application of energy is governed by the post-setting region of FIG. 1.

The phase change material used in the instant invention possesses a continuum of states extending from the reset state to the set state. The states include the reset state, a series of intermediate states along the high resistance plateau and the set state. The intermediate states and the set state may be obtained by applying energy to the reset state. The states associated with the phase change material may thus be viewed as forming a continuum of states distinguishable in energy relative to the reset state. The programming states described hereinabove are selected from this continuum of states. The programming states are generally associated with discrete data values, such as integers, and have programming energies corresponding to the energy that needs to be added to the reset state of the phase change material to transform the phase change material into the programming states. A particular programming state, for example, has a programming energy corresponding to the amount of energy that must be added to the reset state of the phase change material to transform it into that programming state. The programming energy of a programming state is thus a measure of energy relative to the reset state and each programming state is associated with a unique programming energy.

In a preferred embodiment, each programming state has a unique data value assigned to or associated with it. In another preferred embodiment, consecutive integers are assigned to or associated with programming states in order of increasing programming energy. In these embodiments, a number may be stored by transforning a phase change material to the programming state associated with the number. A unique correspondence of numerical values with programming states provides an ability to store any of a range of numbers in a distinct state of a phase change material. Multiple numbers may be stored in multiple portions of a phase change material. Computations may generally be performed through the providing of energy to effect transformations among one or more programming states according to a computational objective.

As indicated above, each application of a sub-interval amount of energy causes a phase change material in the high resistance plateau to progress toward the set state. Even though the reset and intermediate states along the high resistance plateau have substantially the same electrical resistance and therefore cannot be distinguished on the basis of electrical resistance, each state along the high resistance plateau remains, however, detectably distinct from all others because different amounts of energy are required to set phase change materials described by different points along the high resistance plateau. If, for example, an amount of energy is applied to transform a phase change material described by a first point along the high resistance plateau to a second point along the high resistance plateau, precisely that amount of energy less is needed to transform a phase change material described by the second point to the set state than is needed to transform a phase change material described by the first point to the set state. Since the set state is a detectably distinct low resistance state relative to states along the high resistance plateau and since the amount of energy needed to set phase change materials described by any point along the high resistance plateau can be determined, different points along the high resistance plateau are distinguishable and each point along the high resistance plateau may be associated with a different programming state and/or numerical value. As a result, by dividing the energy interval from the reset state to the set state into an appropriate number of sub-intervals, virtually any number of programming states may be defined within the high resistance plateau region of FIG. 1. As a result, the high resistance plateau region may be sub-divided into a series of discrete programming states that may be used for the storage and processing of data. Memory elements comprising a phase change material are not limited to two programming states as is the case with current binary computers, but rather may provide non-binary multistate programming and computing capability and hence, the ability to store more than two numbers in each memory element.

The number of discrete programming states depends on the magnitude of the energy interval associated with the transformation of the phase change material from its reset state (or other starting state) to its set state (the magnitude of the set energy of the reset state or starting state) as well as on the resolution with which it is possible to divide this energy interval into sub-intervals and on practical considerations such as the relative computing or processing advantage associated with having a particular number of programming states. As used herein, starting state or initial state refers to the first or lowest energy programming state along the high resistance plateau. It is preferable to let the reset state be the starting state and, unless otherwise specified, the reset state shall be presumed to be the starting state in the discussion hereinbelow. It is to be recognized however, that a different state along the high resistance plateau may be selected as the starting state.

The magnitude of the energy interval between the reset state and set state can be influenced by the chemical composition of the phase change material, as described hereinbelow. The resolution with which sub-intervals can be defined depends on the energy resolution available from the energy sources that are used to program or read the multistate memory elements acted on by the instant computing methods. The energy sources suitable for transforming a phase change material among its states according to the instant computing methods are described more fully hereinbelow. From a computational standpoint, the number of programming states may influence the nature, speed, parallelness or convenience of computational methods or algorithms. Choosing the number of programming states to be a multiple of two, for example, may permit adaptation of currently available binary algorithms for use in the instant non-binary computing methods. Embodiments, for example, that include 4, 8, 16, 32, 64, etc. programming states are included in the instant invention. The use of 10 programming states permits convenient implementation of algorithms based on the conventional base 10 (decimal) system used in everyday affairs and is also included among the embodiments of the present invention.

By dividing the energy interval required to transform a phase change material from its reset state to its set state into increasingly smaller sub-intervals, it is possible to achieve a large number of programming states and to approach a continuous distribution of programming states. In a manner somewhat analogous to quantum computers, the possibility of creating quasi-continuous programming states provides an opportunity to achieve massively parallel computing capability. Programming states numbering in the hundreds, thousands or even higher may be obtained in memory elements comprising a phase change material and processed by the instant computing methods and algorithms.

Examples of phase change materials suitable for use with the instant computing methods and algorithms are provided in U.S. Pat. Nos. 5,166,758; 5,296,716; 5,524,711; 5,536,947; 5,596,522; 5,825,046; 5,687,112; 5,912,839; 3,271,591 and 3,530,441. The volume of memory material may comprise a mixture of a dielectric material and a phase change material. Examples of such mixtures are described in commonly assigned U.S. Pat. No. 6,087,674, the disclosure of which is hereby incorporated by reference. Materials suitable for the instant computing methods and algorithms include a reset state and a plurality of intermediate states distinct in energy from and having substantially the same resistance as the reset state as well as a set state having a detectably lower resistance than the reset state. Materials meeting this requirement typically include one or more of the elements In, Ag, Te, Se, Ge, Sb, Bi, Pb, Sn, As, S, Si, P, O or mixtures and alloys thereof. In one preferred embodiment, the phase change material comprises a chalcogen. In another preferred embodiment, the phase change material comprises a chalcogen and Ge. In a more preferred embodiment, the phase change material comprises Ge, a chalcogen, and Sb. In a most preferred embodiment, the phase change material comprises Ge, Te and Sb.

Many of the instant computing methods and algorithms include steps involving the providing or application of energy to a phase change material or a memory element comprised of a phase change material. The providing or application of energy may be accomplished by any source capable of delivering a controlled amount of energy to the phase change material. A controlled amount of energy may also hereafter be referred to as a "pulse of energy" or "energy pulse". A "set pulse" is a pulse of energy sufficient to set a phase change material and corresponds to the providing of a setting amount of energy. A "reset pulse" is a pulse of energy sufficient to reset a phase change material and corresponds to the providing of a resetting amount of energy. In the instant invention, energy is used to progress from one programming state to the next and to set and reset the phase change material. The energy delivered can be in the form of electromagnetic radiation (including optical, laser and microwave pulses), electrical energy, optical energy, thermal energy, chemical energy, magnetic energy, mechanical energy, particle beam energy, acoustic energy or combinations thereof using a single energy source or a plurality of energy sources. The concepts of programming, setting and resetting extend to all forms of energy delivery. Delivery of electrical energy, for example, may be in the form of electrical current or voltage and setting may be accomplished by a "set current pulse", a "set voltage pulse"

or the otherwise providing of electrical energy in an amount sufficient to set a phase change material. Similarly, resetting may be accomplished by a "reset current pulse", a "reset voltage pulse" or otherwise providing electrical energy in an amount sufficient to reset a phase change material. Analogously appropriate terms can be defined with respect to other forms of delivering, applying or providing energy in amounts sufficient to set or reset a phase change material.

Energy is required to perform at least three basic functions in the instant invention: programming, reading and resetting. In its simplest form, programming involves the writing or storing of data or information in a phase change material. If not already in numerical form, the input data is preferably converted to numerical form before writing. The conversion of data to numerical form may be accomplished by assigning a distinct numerical value to each datum. Words, for example, may be comprised of letters. Each letter represents a datum that may be assigned a distinct numerical value and the sequence of numerical values corresponding to the letters of a word may be stored to represent the word. Symbols and other types of data may be treated analogously. A variety of techniques also exist in the prior art for converting letters and symbols into binary numbers. Analogous techniques may be readily adapted or newly developed for the conversion of letters and symbols into non-binary numbers. Consequently, the reliable and reproducible storage of numbers represents a basic step in the process of writing and manipulating data. In the following discussion, the storage, processing and otherwise manipulation of data is described for data in numerical form. It is to be recognized, however, that all manner of data may be converted to or represented in numerical form.

In the instant computing methods, writing or programming is accomplished by providing energy, in an amount characteristic of the number to be stored, to a phase change material. The characteristic energy may depend on the setting energy of the reset state of the phase change material, the number of programming states, and the sub-interval of energy required to transform the phase change material from one programming state to the next. In one embodiment, the energy characteristic of or corresponding to a number is an amount of energy proportional to the number. The sub-interval of energy required to progress from one programming state to the next is hereafter referred to as the "programming interval", "program interval", "program interval energy", "program pulse", "increment energy", "increment interval" or equivalents thereof.

In one embodiment of the instant invention, the reset state represents the number zero and a uniform increment energy is used to progress from one programming state to the next. As a result, all programming states are equally separated in energy and each application of the increment energy corresponds to increasing the value of the number stored by one. Thus, the number "1" may be stored through one application of the increment energy to the reset state; the number two may be stored through two applications of the increment energy to the reset state etc. up to the maximum number storable in the volume of memory material being used to store the number. The application of a uniform increment energy may also hereafter be referred to as a "uniform increment pulse" or other equivalent term.

In one embodiment, the maximum number storable is equal to the number of programming states defined or otherwise present along the high resistance plateau described hereinabove. If a uniform increment energy is used and the reset state is selected as the starting state along the high resistance plateau, the number of programming states in this embodiment is equal to the setting energy of the reset state divided by the increment interval separating the programming states. Thus, for example, ten programming states would result in this embodiment if the setting energy of the reset state were divided into ten equal sub-intervals and the reset state is included as a programming state. Application of nine or fewer incrementing amounts of energy in this example (including the reset state, the case of zero applications of the increment energy) places the phase change material in a programming state corresponding to one of ten different numbers. The maximum number storable in this example corresponds to the tenth programming state and is achieved by applying nine of the uniform increment pulses to the reset state. The value of this maximum storable number would be "9" if the reset state is chosen to be "0". Application of a tenth incrementing amount of energy in this example (i.e. application of one incrementing pulse to a phase change material in the tenth programming state) sets the phase change material by transforming the phase change material from the tenth programming state to the set state.

In another embodiment of the instant invention, the set state is used as a programming state. If a uniform incrementing interval is used in this embodiment and the reset state is included as a programming state, the number of programming states is given by one more than the setting energy of the reset state divided by the increment interval. Thus, for example, eleven programming states would result in this embodiment if the setting energy of the reset state were divided into ten equal sub-intervals. The eleventh programming state would be the set state of the phase change material and would be achieved upon application of ten of the uniform incrementing amounts of energy. The value of the maximum storable number would be "10" in this embodiment if the reset state were chosen to be "0".

Although the choice of "0" as the value of the reset state is a preferred embodiment of the instant invention, embodiments in which another programming state is assigned the value "0" are also possible. In principle, any programming state may be assigned the value "0". In embodiments employing a uniform programming interval in which a programming state other than the reset state is chosen to be "0", the maximum storable number would correspond to the programming state that requires one program pulse to reach the programming state chosen to be "0". For example, if the fourth programming state were chosen to be "0", then the third programming state would represent the maximum storable number. In embodiments in which the set state is available as a programming state, the set state may also be selected as "0". Since the set state is readily distinguishable on the basis of its lower electrical resistance from all other programming states, assigning the value of "0" to the set state may provide a computational speed or processing algorithm efficiency advantage. Unless otherwise specified, the majority of the discussion hereinbelow is based on assigning the value of "0" to the reset state. It is to be recognized, however, that this choice is made for the convenience of discussion and does not represent a limitation on the practice of the instant invention.

Variations of the preceding embodiments in which non-uniform programming intervals or unequal increment intervals are used constitute additional embodiments of the instant invention. As used herein, non-uniform programming intervals refer to any sequence of programming intervals in which the programming states are not equally spaced in energy. When non-uniform program intervals are used, the number of programming states depends on the programming strategy of the computer. As used herein, programming strategy includes a prescribed sequence of sub-interval applications of energy in which the program interval from one programming state to the next, as well as the cumulative applied energy from the reset state to each programming state, are specifically defined. The programming strategy may be based on any combination of uniform or non-uniform program intervals extending from the reset state to the set state and may or may not include the reset state or set state as programming states. Unless otherwise specified, the discussion hereinbelow is based on a programming strategy using uniform program intervals. It is to be recognized, however, that this choice is made for the convenience of discussion and does not represent a limitation on the practice of the instant invention.

Preferably included within a programming strategy is an assignment to or association of data values with the programming states such that each programming state corresponds to a different data value. Preferably, the data values associated with the programming states are integers. More preferably, the integers are consecutive. Embodiments in which integer values are associated in increasing as well as decreasing order of programming energy are envisioned. For example, if the reset state is associated with a data value of zero, application of one programming interval of energy places the material in a programming state associated with a data value of one, application of another programming interval of energy places the material in a programming state associated with a data value of two etc. Alternatively, it is possible to associate data values with programming states in a decreasing order of programming energy. For example, if the set state is associated with a data value of zero, the programming state to which one programming interval of energy was provided to obtain the set state would be associated with a data value of one etc. Association of data values with programming states may be completed in a variety of ways to facilitate specific computations or user preferences.

Although storage of data in numerical form is a preferred embodiment, the instant invention is not limited to numerical data. The programming states of the instant invention may be assigned to non-numerical data. Letters may be stored, for example, by sub-dividing the high resistance plateau into 26 programming states and assigning a different one to each letter of the alphabet. Words and other combinations of letters may also be stored letter by letter in the registers of a memory group.

Registers and Place Value

When computing, it is necessary to have the ability to write and store large numbers. One way to store large numbers is to assign a large number of programming states to the high resistance plateau of the phase change material used in the memory elements of the instant invention. This may be done by choosing a small incrementing energy interval between programming states. Each of the large number of programming states may then be chosen to correspond to a different number.

In the instant invention, large numbers are preferably stored using the memory groups described hereinabove. Memory groups are groupings of registers that may be used to store multidigit numbers. Each register is used to store one digit of a multidigit number and each register preferably corresponds to the smallest volume of phase change memory material capable of being programmed into any of the programming states assigned to the memory elements of the instant invention. In embodiements in which programming states are defined and associated with numerical values, storage of a number may entail providing energy in an amount sufficient to transform a register, memory group or volume of phase change material to the programming state associated with the number being stored. When the reset state is chosen to have the value "0", the maximum number storable in a single register is equal to one less than the number of programming states. Numbers in excess of the maximum number storable in a single register require two or more registers.

The number of memory elements or registers included in a memory group is variable and is generally determined by the maximum number of digits that one wishes to associate with numbers for the purposes of storage. A multidigit number may have an arbitrarily high number of digits. In practice, however, it is preferable to set an upper limit on the number of digits that one associates with a particular multidigit number and to use exponentiation for numbers whose values exceed the maximum number obtainable with a particular maximum number of digits allocated or assigned to a memory group for the purpose of storing numbers. The maximum number of digits that one associates with a number represents a tradeoff between precision of computation and efficiency of manipulation. A larger number of digits leads to greater precision, but does so at the expense of processing speed because more digits require more registers and a greater number of register operations during computing. As an example, one may wish to assign ten memory elements or registers to each memory group. By doing so in this embodiment, one would be choosing to limit the number of digits associated with a particular number to ten so that only numbers with ten or fewer digits could be stored in a memory group. Numbers with more digits would require an exponentiation scheme or the use of more than one memory group.

A series of registers may be used to define a place value arithmetic system for the storage and processing of numbers. In one preferred embodiment, the reset state is selected to be zero, the base of the arithmetic system is given by the number of programming states and the maximum storable number in a single register is one less than the base. In a conventional binary computer, for example, two programming states are available and the numbers 0 and 1 are stored and processed according to a base 2 arithmetic system. In an embodiment of the instant invention in which ten programming states are used, numbers are stored and processed according to a base 10 arithmetic system. Thus, the ten programming states available in a single register of the memory element of the instant computer correspond to the numbers 0, 1, 2, 3, 4, 5, 6, 7, 8, and 9. Registers for other arithmetic bases can be analogously described as can registers for embodiments in which the set state is chosen as zero.

In the instant invention, large numbers are preferably stored using multiple registers where each of the multiple registers corresponds to a different power of the base of the arithmetic system used. Each register stores a digit of a multidigit number that corresponds to the multiple of a different power of the base to be used as an additive factor in representing the multidigit number being stored in the set of registers. A first register is used to store the multiple of the base raised to the power zero, a second register is used to store the multiple of the base raised to the power one, a third register is used to store the multiple of the base raised to the power two, etc. up to the maximum number of registers permitted for a number in a memory group. The number 372 in base 8, for example, may be stored in a series of three registers, each of which has eight programming states where the reset state corresponds to zero, by applying two uniform program pulses to a first register, seven uniform pulses to a second register, and three uniform program pulses to a third register.

The numbers corresponding to multiples of different powers of the arithmetic base are the digits of a multidigit number. The number 372 in base 8, for example, contains three digits: a "3" to represent the multiple of the second power of 8, a "7" to represent the multiple of the first power of 8, and a "2" to represent the multiple of the zeroth power of 8. Each digit is stored in a separate register. Digits are analogously defined in other base systems and for embodiments in which the set state is chosen as zero. The decimal (base 10) equivalent of the number stored in a memory group is obtained by multiplying the digit stored in each register by the power of the base represented by the register and summing over all registers in the memory group.

As indicated hereinabove, any number of registers can be allocated for the storage of numbers. In one embodiment utilizing base 10, for example, ten registers may be allocated to each memory group and the maximum multidigit number storable in the memory group would correspond to values of "9" in each of the 10 registers; in other words $10^{10}-1$. Numbers higher than the maximum number storable over all registers allocated to a memory group require the use of exponentiation or the combining of two or more memory groups.

Numbers requiring fewer than all of the registers assigned to a memory group may also be stored. Such numbers may be stored by including zeroes in registers corresponding to place values not needed in the representation of a given number. As an example, consider the storage of the number 372 in a memory group to which ten registers are assigned in a base 10 arithmetic system. This number requires only three registers for storage and may be stored by including zeroes in the registers corresponding to place values of 1000 or greater, a "3" in the register corresponding to a place value of 100, a "7" in the register corresponding to a place value of 10 and a "2" in the register corresponding to a place value of 1. The zeroes included in registers corresponding to place values in excess of the maximum place value needed to represent a number are hereafter referred to as leading zeroes. In this example, the number 372 would formally be stored as 0000000372 and would contain seven leading zeroes. Zeroes that appear in registers corresponding to place values lower than the maximum place value needed to represent a number are not leading zeroes. Such zeroes are hereafter referred to as non-leading zeroes or internal zeroes. The number 104, for example, contains one non-leading or internal zero.

Reading

The reading of stored numbers requires suitable probing or manipulation of registers. If the set state is available as a programming state, it is readily distinguished from all other programming states through its lower electrical resistance. Other programming states, however, lie along the high resistance plateau portion of the electrical resistance curve and possess substantially identical electrical resistances. Consequently, direct measurement of the electrical resistance of a register does not provide a means for discriminating programming states and reading the registers of the instant invention. Alternative methods are required.

One method for reading the value stored in a register is to identify a physical change associated with the progression of the phase change material across the high resistance plateau of the electrical resistance curve. As indicated hereinabove, the application of energy to a phase change material described by a point along the high resistance plateau necessarily produces a one-directional progression toward the set state. Consequently, the application of energy (in general or in the form of programming pulses) alters the phase change material in some way. The observation that the altering of the material does not produce a material change in electrical resistance does not exclude the possibility that some other physical property may be used to distinguish programming states along the high resistance plateau. Identification of a suitable physical property is aided by knowledge or speculation about the influence of applied energy on the physical state of a phase change material.

While not wishing to be bound by theory, the instant inventors believe that the application of energy to a phase change material in the high resistance plateau region of the electrical resistance curve may lead to an increase in the crystalline fraction present in the phase change material. Phase change materials described by the high resistance plateau are believed to be amorphous materials that contain regions of crystalline material hereafter referred to as "crystallites". It is believed that the volume fraction of crystallites is smallest in the reset state and that it continuously increases upon application of energy as the material progresses along the high resistance plateau toward the set state. The application of energy may increase the size of crystallites present in the reset state, create new crystallites or produce both effects. Since the crystalline state has a higher electrical conductivity (lower electrical resistance) than the amorphous state, the setting transformation is believed to coincide with the formation of a contiguous network of crystallites within the volume of the phase change material. The reset transformation is believed to involve disruption of this contiguous network and conversion of at least a portion of the crystallites to the amorphous state. Formation of amorphous material may occur through the melting of crystallites followed by quenching or through enhancement of the mobility of atoms or groups of atoms in the crystallites. Enhanced mobility may lead to a break-up and dissolution of crystalline material.

The energy interval between the reset state and set state may be influenced by the size of crystallites present in the reset state. If smaller crystallites exist in the reset state, they may require additional energy to increase in size enough to achieve a contiguous network of crystallites. Consequently, it may be possible to control the energy interval available along the high resistance plateau for programming states. Many of the phase change materials suitable for the instant invention are believed to have small crystallites in their reset state.

Physical techniques may be available to measure any change in the crystalline volume fraction that may occur as a phase change material progresses along the high resistance plateau toward the set state. The size of crystallites, for example, may be measurable through a microscopy technique such as TEM or through a high resolution x-ray diffraction technique. Such techniques could be used to measure crystallinity and assess progress from the reset state toward the set state. If the programming interval is known, the volume fraction of crystallites associated with each programming state may be determined and a correlation may be developed for reading registers.

The discrete nature of the programming states of the phase change material also permits the reading of registers without the need to monitor and correlate a change in a physical property. Position along the high resistance plateau is the principle feature that distinguishes the different program states. Position along the high resistance plateau may be considered in one of two ways. First, position may be uniquely described or labeled according to the number of programming pulses or increment intervals or amount of energy that needs to be added to the reset state to reach the position associated with a particular programming state along the high resistance plateau. In this embodiment, the requisite amount number of programming pulses (or increment intervals or amount of energy) is known from the write or storage process and may be used as a way to identify the programming state and its stored value during the read process. A pulse counter, for example, may be used to record the number of pulses applied to a given register.

Second, and more preferably, position along the high resistance plateau may be uniquely described or labeled according to the amount of energy or number of programming pulses or increment intervals needed to reach the set state. In this embodiment, for example, the value stored in a register may be determined by subtracting the number of programming pulses required to reach the set state from the number of sub-intervals into which the set energy of the reset state has been divided. This process of reading is advantageous because the set state is a unique and unambiguous state that can readily be detected because of its lower resistance. Reading may be accomplished by first applying a programming pulse to the register and then measuring its resistance. If the measured resistance corresponds to the value associated with the high resistance plateau, the phase change material is not yet in its low resistance set state. By repeating the process of applying a programming pulse and measuring the resistance of the register, the number of programming pulses required to reach the set state can be determined. Comparison with the total number of programming states may be used to provide a difference that corresponds to the value stored in the register.

Depending on whether the set state is included as a programming state, the preceding process for determining the value stored in a register may be expressed equivalently in alternate terms. In embodiments in which the set state is not included as a programming state, the number of sub-intervals into which the set energy of the reset state has been sub-divided may be equal to the base of the arithmetic system used to store and process numbers. If so, the value stored in a register may be determined by subtracting the number of programming pulses required to convert the register to its set state from the base of the arithmetic system. As used herein, the value stored in a register refers to the numerical value associated with the programming state in which the register exists or is transformed to.

As an example, consider the reading of a register that stores the digit "1" in a base 4 arithmetic system and a uniform programming interval strategy in which the set state is not used as a programming state. Four sub-intervals are required for a base 4 arithmetic system when the set state is not used as a programming state. The four sub-intervals provide four programming states (including the reset state) and the set state. In this example, the four programming states correspond to the digits 0, 1, 2, and 3 in order of increasing programming energy. Storage of a "1" in the register of this example implies that one programming pulse has been applied to the reset state and that the phase change material is in its second programming state. To read the register, we apply one programming pulse and check to see whether the register has reached its set state by measuring resistance. If it has not, we repeat until the set state is reached. In this example, the set state is reached upon application of a third programming pulse. Consequently, the number stored is given by 4 (the base of the arithmetic system or the number of sub-intervals) minus 3 (the number of programming pulses required to convert the register to its set state). The stored digit is thus seen to be a "1".

A different reading process applies to situations in which the set state is used as a programming state. When the set state is used as a programming state, the number of sub-intervals is equal to the value of the maximum digit value available in the base of the arithmetic system being used and typically, the set state corresponds to the maximum digit storable in a register. As a result, the digit stored in a register may be obtained by subtracting the number of programming pulses required to convert the register to its set state from the maximum digit value storable in a register in the base of the arithmetic system being used. The maximum digit storable is one less than the base.

As an example, consider the reading of a register that stores a "1" in a base 4 arithmetic system and a uniform programming interval strategy in which the set state is included as a programming state. Three sub-intervals are required for a base 4 arithmetic system when the set state is used as a programming state. The three sub-intervals provide four programming states, including the reset state and the set state. The four programming states correspond to the digits 0, 1, 2, and 3. Storage of a "1" in the register of this example implies that one programming pulse has been applied to the reset state and that the phase change material is in its second programming state. To read the register, we apply one programming pulse and check to see whether the register has reached its set state by measuring resistance or some other suitable property. If it has not, we repeat until the set state is reached. In this example, the set state is reached upon application of a second programming pulse. Consequently, the digit stored is given by 3 (the maximum digit value storable in a single register in the base of the arithmetic system being used or the number of sub-intervals) minus 2 (the number of programming pulses required to convert the register to its set state). The stored digit is thus seen to be a "1".

In reading processes involving the counting of the number of programming pulses required to convert a register storing a number to its set state, the register remains in the set state at the conclusion of reading. If desired, the register may be restored to its original value. Since the reading process has revealed the value of the number originally stored, the register may be restored to its original value by first resetting the register and then applying programming pulses in a number equal to the original digit value.

The process of resetting involves the process of applying energy to the set state in an amount sufficient to newly create the high resistance state. As indicated hereinabove, the process of resetting occurs in the post-setting region of the electrical resistance curve, such as the one shown in FIG. 1 herein, that governs the behavior of the phase change material. The transition from the high resistance plateau to the set state is one-directional and cannot be reversed by moving to the left in the electrical resistance curve. Consequently, a phase change material cannot be "unset" to its original high resistance plateau state. Instead, a phase change material must be reset by applying sufficient energy to newly create a high resistance plateau by driving the phase change material to the far right side of the electrical resistance curve. The rightmost end point of the post-setting region corresponds to the formation of a new high resistance plateau for the phase change material. Suitable energy sources for the instant invention must be capable of providing enough energy to reset the phase change material.

As indicated hereinabove, many numbers stored in memory groups will include one or more leading zeroes. The frequent occurrence of leading zeroes and the fact that many computational operations need not consider leading zeroes indicates that it may be advantageous to have the ability to readily detect the presence of leading zeroes. Consider the addition of the number 372 with the number 128 in a base 10 arithmetic system in which ten registers are assigned to each memory group. The number 372 may be stored as 0000000372 and the number 128 may be stored as 0000000128. In each number, seven leading zeroes are present and need not be acted on by many mathematical operations. Addition or subtraction, for example, of the two numbers does not require manipulation of the leading zeroes. Consequently, it is expected to be more efficient to readily detect the presence of leading zeroes so that they may be skipped over or ignored during many mathematical operations.

When the reset state is chosen as the programming state corresponding to a zero, the reading of leading zeroes according to the process described hereinabove may require the addition of several programming pulses to transform a leading zero into the set state. This addition of programming pulses must be completed on each register of each number that contains a leading zero. As a result, mathematical operations may require a large number of functionally unimportant manipulations when the reset state is chosen as the programming state corresponding to zero. Computationally efficiency may thereby be impaired.

In order to promote computational efficiency, it may be preferable to assign the set state to be the programming state corresponding to zero. By doing so, a leading zero becomes readily discernible through an electrical resistance measurement and the addition of programming pulses is not required to detect a leading zero. Consequently, computational efficiency may be improved. As indicated hereinabove, the instant invention includes as an embodiment a programming strategy in which the set state corresponds to zero.

Computing Methods

In addition to the storage of numbers and digits, programming involves the development and implementation of algorithms designed for the purposes of processing stored data in desired ways. A computer, for example, needs to be able to perform the four basic arithmetic operations: addition, subtraction, multiplication and division. Efficient exploitation of the multistate storage capability of a phase change material requires the original development of new algorithms. Conventional binary algorithms are designed for simple two state memory elements. Realization of the advantages inherent to multistate or non-binary computing necessitates a re-thinking of processing algorithms. Specific consideration of the data storage and programming characteristics of a multistate phase change memory material must be included. A more complete discussion of algorithms designed for multistate memory elements is now presented.

The detailed development of specific computing methods or algorithms for the instant invention is predicated upon basic assumptions or choices made with respect to the phase change memory material and its operation. Among the basic attributes that may need to be decided upon are the choice of zero, the number of registers allocated per memory group, the number of programming states, the arithmetic base, the data values associated with the programming states and whether the set state is included as a programming state. The basic principles of processing and storing are similar regardless of which choices are made, but specific details may vary. Users of the instant invention have great latitude in establishing pertinent operating parameters, conditions and preferences.

In the following discussion of computing methods, we consider as an example the situation in which the reset state is chosen as "0", the number of programming states is equal to the base of the arithmetic system, and the set state is not included as a programming state. We also assume that a fixed number of registers is allocated to each memory group for the storage of multidigit numbers and that this allocated number is the same for each memory group. This allocation of registers is tantamount to choosing a maximum volume of memory material that will be made available to an individual multidigit number and partitioning the total volume of memory material available accordingly into conforming memory groups. Any number of registers may be allocated to the memory groups. The allocated number of registers impacts the magnitude of the maximum number storable in a memory group by establishing the maximum number of digits that can be stored for a number. This maximum number of digits may influence computing efficiency because it may establish when exponentiation becomes necessary, the precision available for decimals, and the number of leading zeroes that must be reckoned with during computation. In one embodiment of the instant invention, the allocated number of registers is equal to the base of the arithmetic system.

The number of registers allocated to a memory group corresponds to the maximum number of digits that may be stored for a number. The storage of a number may require fewer than the allocated number of registers. As indicated hereinabove, when this situation occurs, the number is stored register by register (digit by digit) within the allocated number of registers according to the place value system associated with the base of the arithmetic system being used. If the number does not require all of the allocated number of registers, the unused registers remain allocated to the number, but contain "0" 's so that they do not contribute to the value of the number stored. These unused registers contain leading zeroes that remain available, if necessary, for processing of or operation on the stored number.

Many of the instant computing methods involve register by register manipulation of memory groups through repeated application of a processing step. In order to step through registers, it is convenient to label or identify them with a "register pointer" or "counting register". As used herein, "register pointer" and "counting register" refer to specifying, identifying or distinguishing the individual registers within a memory group. Position within a memory group is marked by the counting register. Each register of a memory group is associated with a unique setting, value or state of the counting register. Each setting, value or state of the counting register may equivalently be viewed as corresponding to a different place value within the arithmetic base of the computation system. During implementation of a computing method, algorithm or processing step therein, the setting, value or state of the counting register is fixed and the associated register is operated on, processed or manipulated according to the objective of the computing method or processing step. Once the register has been acted on, the counting register may be incremented and the next register may be operated on, processed or manipulated according to the objective of the method or processing step. The method or processing step within a computing method concludes when the counting register is incremented to or otherwise reaches a pre-determined terminal state. Generally, the terminal state corresponds to the processing of all or an appropriate subset of registers within a memory group. In equivalent terms, the act of incrementing the counting register may be viewed as moving a register pointer from one register to the next or from one place value of the arithmetic system to the next; with the computing method or processing step occurring at the register being pointed at. In multidigit numbers, each register corresponds to a different digit and the incrementing of the register pointer is tantamount to progressing from one digit to another. The counting register may or may not have the same number of states as the registers of a memory group associated with the counting register. It is preferable to have the number of states of the counting register be at least equal to the number of non-leading zero digits stored in a memory group associated with the counting register. In one embodiment, the number of counting register states is equal to the number of registers allocated to a memory group.

The counting register may be a circuit external to the memory group or a portion of the phase change memory material separate from the register or memory element being operated on by an algorithm. In one preferred embodiment, the counting register is a volume of phase change material and has programming states that correspond to the programming states of the registers of a memory group. In another preferred embodiment, the counting register is a volume of multistate phase change memory and the terminal state of the counting register is the set state of the phase change material. In such an embodiment, a computing method, algorithm or processing step terminates when the counting register reaches its set state. Selection of the set state as the terminal state for the counting register is advantageous because it can be readily detected and therefore provides a convenient endpoint for a computing method or processing step. The initial state of the counting register may be set so that the counting register reaches its set state upon its increment following the action of the computing method on the fmal digit of a number. For example, the application of one programming pulse to the counting register may be used to represent progress from one digit to the next of a multidigit number. Once all digits of a multidigit number have been acted on by a computing method, further application of a programming pulse causes the counting register to transform into its set state thereby signifying the end of processing according to the method.

In the description of computing methods or algorithms presented hereinbelow, the letters of the alphabet (e.g. "a", "b", "c") are used to indicate distinct memory groups. Registers within a memory group are distinguished by subscripts. Thus, for example, $b_0$ and $b_1$ refer to two different registers of a memory group b and correspond to two different digits in the number stored in memory group b. The letter "r" is an index used to refer to the counting register. Different values of r indicate that different registers within a memory group are being pointed at and are being acted on by the computing method. The initial and final values of r shall hereafter be referred to as $r_{initial}$ and $r_{final}$, respectively, where $r_{final}$ corresponds to the terminal state described hereinabove and is preferably associated with the set state of the counting register. The index r may also be used as a subscript to refer to the register of a memory group associated with a particular or current value of r. Thus, for example, br refers to the register of memory group b associated with the current value of r as well as to the digit stored therein. The value of r, including $r_{initial}$ and $r_{final}$, is generally set and varied according to the objective of the computing method, algorithm or processing step.

In some computing methods, it is useful to associate a given counting register with processing steps occurring simultaneously or sequentially at two or more memory groups. In these situations, a single counting register index r may be used for all memory groups being acted on and unless otherwise stated, it is assumed that a given value of r refers to corresponding registers in each of the different memory cells. Equivalently stated, a given value of r refers to digits representing the same place value location in different memory groups. If, for example, $a_r$ refers to the tens digit for a particular value of r, then $b_r$ also refers to the tens digit for the same value of r where memory groups a and b are being commonly acted on by an algorithm or processing steps.

In some computing methods, it is useful to define two counting registers for the purpose of acting or operating on different digits of a multidigit number stored in a particular memory group. In the following algorithms, second and higher counting registers will be labeled consecutively with letters beginning with s. Thus, r refers to a first counting register, s refers to a second counting register, t refers to a third counting register etc.

In a preferred embodiment, the volume of memory material assigned to the counting register is equivalent to the volume of memory material associated with registers within the memory groups used to store digits and includes the same number of programming states. This embodiment is convenient because the energy source used can be applied in the same way to both the counting register and the registers within memory groups. This embodiment implies that the number of digits associated with stored numbers is equal to the base of the arithmetic system. Embodiments in which the number of digits associated with stored numbers is greater than or less than the base of the arithmetic system are also possible. Such embodiments require separate energy sources for the counting register and memory groups or suitable modification of the energy source used for the memory groups when it is applied to the counting register. The peak intensity or duration, for example, of the energy source may be defined differently for the counting register and memory groups. Alternatively, the programming interval associated with the counting register may differ from that used for the registers used to stored digits.

In the following example algorithms, we illustrate the instant invention with embodiments in which the reset state is chosen as "0", the programming states of the memory group and counting register are uniform, the number of programming states in the registers of memory groups is equal to the base of the arithmetic system, the set state is not included as a programming state, the number of programming states for the counting register is the same as for registers within the memory groups and the terminal state of the counting register is the set state. These conditions are selected for the purposes of illustration and are not intended to limit the practice of the instant invention. Where appropriate, remarks pertinent to other embodiments will be included. Also, many of the computing methods described herein include steps for incrementing a register. The process of incrementing a register refers to the application of a programming pulse. Incrementing by one, for example, is accomplished by the application of one programming pulse and corresponds to transforming a register from one programming state to the next or from the final programming state to the set state.

Specific embodiments of computing methods are now described. Any one or combination of methods or all methods may be accomplished with a particular volume of phase change material. It is possible, but not required, to accomplish different computing methods within different volumes of phase change materials. To facilitate computing efficiency, it is preferable to have the ability to complete as many computing methods as possible within a particular volume of phase change material. Through appropriate storing, processing, erasing, and rewriting of data, this capability may be achieved in the instant invention. Typically, one computing method would be initiated and terminated before a second computing method is implemented within a particular volume of phase change material. The versatility of being able to use many different computing methods within a particular volume of phase change material is a feature of the instant invention. In a preferred embodiment, the mathematical operations of addition, subtraction, multiplication and division are completable within a particular volume of phase change materials using the computing methods disclosed herein. In another preferred embodiment, the mathematical operations of subtraction, multiplication, and division are completable within a particular volume of phase change material using the computing methods disclosed herein. Performance of other combinations of computing methods, included all disclosed computing methods, within a particular volume of phase change material constitute other embodiment of the instant invention.

Resetting

In the implementation of computational methods, it is frequently required or desirable to reset one or more registers or memory groups. As a result, it is useful to develop an algorithm for resetting registers and memory groups. The basic step in resetting the multistate phase change memory groups of the instant invention is to reset all registers in the group. As described hereinabove, the process of resetting involves the application of an amount of energy sufficient to reset the phase change material. In one embodiment, the energy is provided in the form of a reset energy pulse and the core of a resetting algorithm involves the application of a reset pulse to each register of a memory group. Reset pulses may be applied separately and consecutively to the individual registers of a memory group. By stepping through all registers, the memory group may be reset. In embodiments in which the reset state is the programming state assigned to zero, resetting may be accomplished by excluding registers containing leading zeroes and applying a reset pulse or a reset amount of energy to registers beginning with the register with the highest place value that does not contain a zero and stepping and applying a reset pulse register by register through the remainder of the registers of the memory group.

Figure 2:
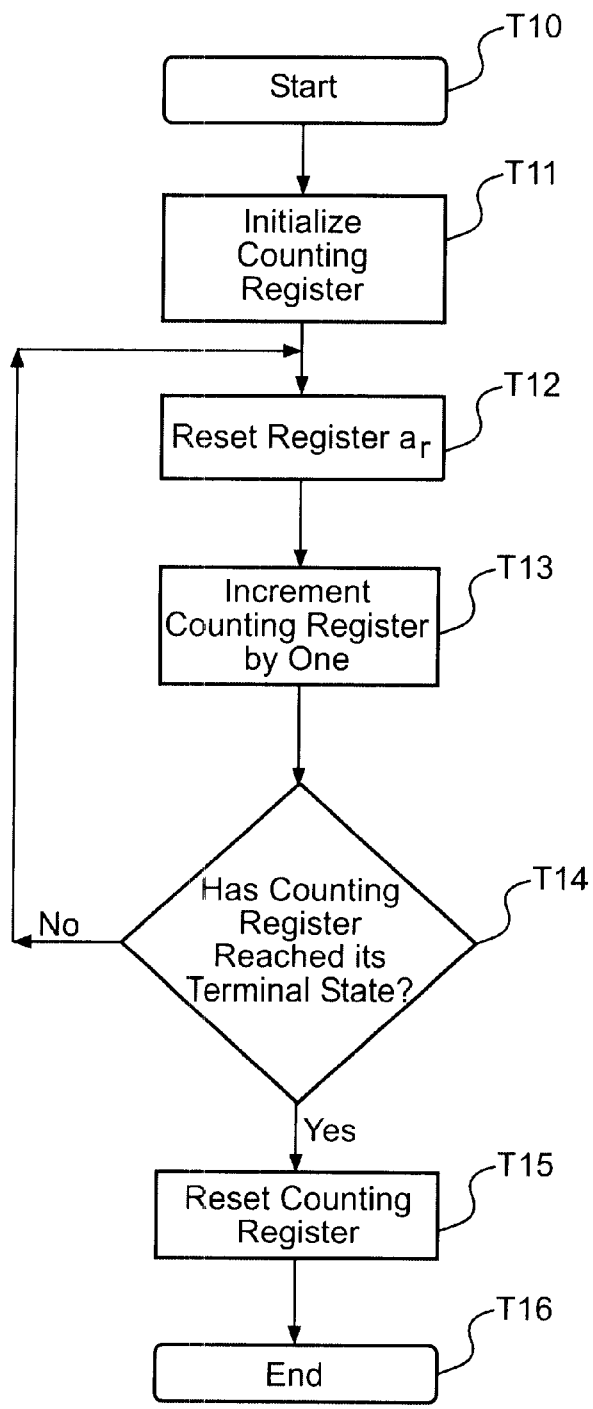
FIG. 2 shows steps in a method of resetting denoted RESET(a).

A schematic depiction of a resetting algorithm is depicted in FIG. 2 herein. The algorithm is labeled RESET(a) to indicate that the algorithm is designed to reset memory group a. The algorithm is started at step T10. At step T11, initialization of the counting register occurs. Initialization refers to the setting of the value of $r_{initial}$ by placing the counting register in its initial programming state. Initialization corresponds to pointing at the first register of the memory group to be operated on. Steps T12, T13, and T14 constitute an iterative loop that represents the basic processing step of the algorithm. In step T12, the register $a_r$, corresponding to the current value of the register counter r, is reset. In the first pass through the loop, the value of r is $r_{initial}$ and the first register of memory group a is reset. In subsequent passes through the loop, the value of r is incremented and the remaining registers of the memory group are reset. Step T12 may occur through the application of a reset energy pulse. In step T13, the counting register is incremented by one to signify pointing at the next register in the memory group. The incrementing of the counting register is accomplished by the application of a program energy pulse. The program energy pulse transforms the memory material of the counting register from its current programming state to the next programming state. Step T14 is a conditional test step that tests whether or not the counting register has reached its terminal state. In one embodiment, the terminal state is the set state of the counting register and the conditional test can be implemented by measuring the electrical resistance or some other distinguishable property of the low resistance set state, as described hereinabove. If the counting register is not in its terminal state, the method loops back to step T12 and the next register of the memory group is reset. The counting register is once again incremented by one in step T13 and the conditional test at step T14 is completed. The loop represented by steps T12, T13, and T14 is repeated until the counting register has reached its terminal state. Attainment of the terminal state by the counting register coincides with the value $r=r_{final}$ and indicates that all registers in the memory cell have been reset. Once the counting register reaches its terminal state, the computing method proceeds to step T15. Step T15 is an optional step that corresponds to resetting of the counting register. This step may be useful in preparing the counting register for another computing method or memory group. Step T16 is the ending step of the computing method.

The preceding computing method has been illustrated for the resetting of a single memory group. The computing method is readily extended to the resetting of multiple memory groups. To reset memory groups a and b, for example, we could include a step T12' between steps T12 and T13 in which the register br is reset. Step T12' may be denoted as "Reset register $b_r$," and the method may be named RESET(a,b) to indicate that memory groups a and b are to be reset. The method may be analogously extended to any number of memory groups.

Figure 3:
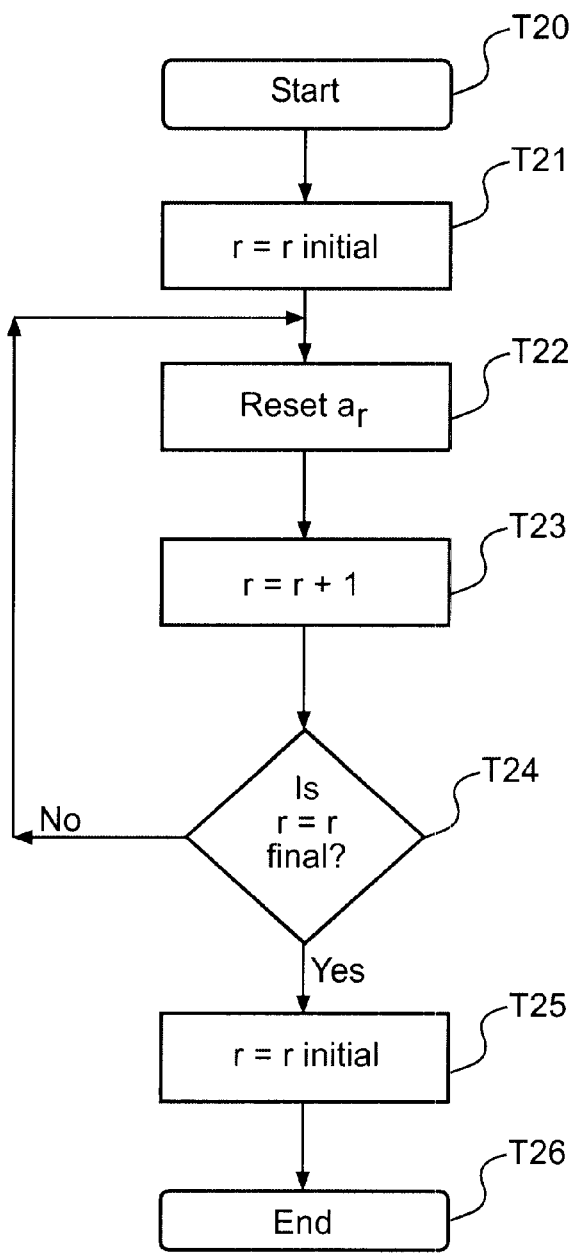
FIG. 3 shows an alternate depiction of the steps in the method of resetting RESET(a).

Disclosed in FIG. 3 herein is an alternative manner of describing the computing method presented in FIG. 2. The steps of the resetting method of FIG. 2 directly correspond to those of FIG. 2, but are offset by ten in number. Thus, the step T20 corresponds to step T10, the step T21 corresponds to step T11, etc. The depiction presented in FIG. 3 is used to illustrate notation that will be used in other computing methods described hereinbelow. In step T21, "$r=r_{initial}$" indicates that the value of r is to be set to $r_{initial}$. This step corresponds to the initialization of the counting register. In the reset step T22, "$a_r=0$" indicates that the register of memory group a associated with the current value of r is to be reset. In step T23, "r=r+1" indicates that the value of r is to be increased by one. This step corresponds to the incrementing of the counting register by one, an action that may be accomplished through the application of a programming pulse to the counting register. In step T24, the conditional test is indicated by "Is $r=r_{final}$?". Step T24 queries whether the counting register has reached its terminal state. If it has not, the computing method loops through steps T22, T23 and T24 until the terminal state is attained. Once the counting register is in its terminal state, the method proceeds to the optional counting register reset step T25 and commences with step T26.

The methods shown in FIGS. 2 and 3 include an initialization step for setting an initial value in the counting register and a conditional test step to determine when the counting register has reached its terminal state. Different approaches may be used to choose $r_{initial}$ and $r_{final}$. As indicated hereinabove, it is preferable to associate $r_{final}$ with the set state of the counting register because the set state is readily identified by a simple test. Thus, the conclusion of a computing method or loop is conveniently identifiable when the terminal state of the counting register corresponds to the set state of the memory material associated with the counting register. When the set state of the counting register is the terminal state, at least two choices for choosing a value of $r_{initial}$ are possible. First, $r_{initial}$ may be chosen to correspond to the reset state of the counting register. In this embodiment, the method addresses (i.e. steps through) all registers in the memory group. This embodiment has the advantage of being simple in execution, but is not necessarily most efficient because any registers that are initially present in their reset state are needlessly acted on by the method.

In a second approach, $r_{initial}$ is set so that the number of programming pulses or increment intervals required to convert the initial state of the counting register to the terminal state of the counting register is equal to the number of non-leading zero digits in the number stored in a memory group. This approach is preferable in embodiments in which the reset state is selected to be the programming state corresponding to zero because it excludes leading zero digits from being processed by the method. In this embodiment, the counting register initialization step involves the application of one programming pulse to the reset state of the counting register for every leading zero present in the number stored in the memory group. (If the counting register is not in its reset state at the outset of the initialization step, a reset pulse is applied before applying the programming pulses.) This initialization procedure implies that the number of programming pulses required to convert the counting register from its initial state to its terminal state is equal to the number of non-leading zero digits in the number stored in the memory group.

In a base 10 situation within this embodiment, for example, the number "0000000472" may be encountered. This number includes seven leading zeroes and three non-leading zero digits. According to the initialization procedure of this embodiment, the counting register would be reset (if necessary) and seven programming pulses would be applied to it in the initialization step. The seven programming pulses place the counting register into its eighth programming state. The eighth programming state corresponds to pointing at the eighth digit of the number. In the example of "0000000472", the eighth digit is a "4" and represents the first non-leading zero digit. One programming pulse is applied to the counting register for each loop passed through in the algorithm. After three loops, one for each non-leading zero digit of the number, the counting register is in its terminal state. At this point, the memory group that originally contained "0000000472" is reset (i.e. has been transformed to "0000000000") and the method proceeds to the end step. Note that the three programming pulses applied in this example may correspond to operating on the three non-leading zero digits in any order. It is preferable to operate on the digits in either ascending ("2", then "7", then "4") or descending ("4", then "7", then "2") order of place value.

The second approach to initialization is advantageous because no computational time or resources are directed at resetting leading zeroes. The second approach sets the counting register to a value determined by the number of non-leading zero digits of a number stored in a memory group and streamlines computing by operating only on non-leading zero digits. The methods as written in FIGS. 2 and 3 permit any choice of $r_{initial}$ and $r_{final}$. Specific choices constitute different embodiments. Similar understanding applies to the computing methods presented hereinbelow.

The reset methods presented in FIGS. 2 and 3 may also be used for embodiments in which the reset state is a programming state corresponding to a non-zero number. In many such embodiments, the reset state is the first programming state and is associated with the number one. In these embodiments, execution of the reset methods presented in FIGS. 2 and 3 is tantamount to setting the registers of a memory group acted on by the method to one. This means that the resetting of memory groups and the zeroing out of memory groups correspond to different acts in these embodiments. Zeroing may be accomplished by first resetting according to the algorithm of FIGS. 2 or 3 and then applying the appropriate number of programming pulses to reach whatever programming state has been associated with zero. Frequently, the set state is selected as the programming state corresponding to zero and the act of zeroing is accomplished by setting all registers of a memory group.

Halfcopy

In the implementation of computational methods, it is frequently required or desirable to copy the contents of one memory group to one or more other memory groups. As a result, it is useful to develop a method for copying memory groups. As described hereinbelow, the following HALF-COPY methods may be used as an intermediate step in a copying method. Two different HALFCOPY methods, HALFCOPY_1 and HALFCOPY_2, are described in the following discussion.

The HALFCOPY methods return what shall hereafter be referred to as the complement of a number. As used herein, the complement of a number refers to the result obtained by subtracting the digits of a stored number, separately and individually, from the base of the arithmetic system. Consider the number "587" in a base 10 system as an example. The complement is obtained through digit-by-digit subtraction of the digits of the number from the base of the arithmetic. The first digit of the complement of "587" is 10−5=5, the second digit is 10−8=2, and the third digit is 10−7=3. Thus, the complement of "587" is "523". If the number "587" in a base 10 arithmetic system were input into HALFCOPY, the method would return "523". The complement may be analogously defmed for other base systems and is applicable to any number of registers allocated to stored numbers.

Treatment of non-leading zeroes requires special attention in the HALFCOPY methods. The number "907" in a base 10 arithmetic system provides an example that illustrates the complication encountered for numbers containing non-leading zeroes. Applying the preceding method for computing the complement to "907" returns "1" (10−9) as a first digit, "10" (10−0) as a second "digit", and "3" (10−7) as a third digit. The complement of "907" is thus determined to be "1(10)3". For any arithmetic base in general, the presence of a non-leading zero leads to a "digit" in the complement that equals the base of the arithmetic system. Such "digits" are formally "10's" in the arithmetic base and, if used, would require two registers for storage. Since it is desirable to execute computing methods in a register-by-register fashion, it is preferable to adopt a convention or definition with respect to the treatment of non-leading zeroes in the computation of the complement of a number. The methods HALFCOPY_1 and HALFCOPY_2 presented hereinbelow represent two different strategies for treating non-leading zeroes.

Figure 4:
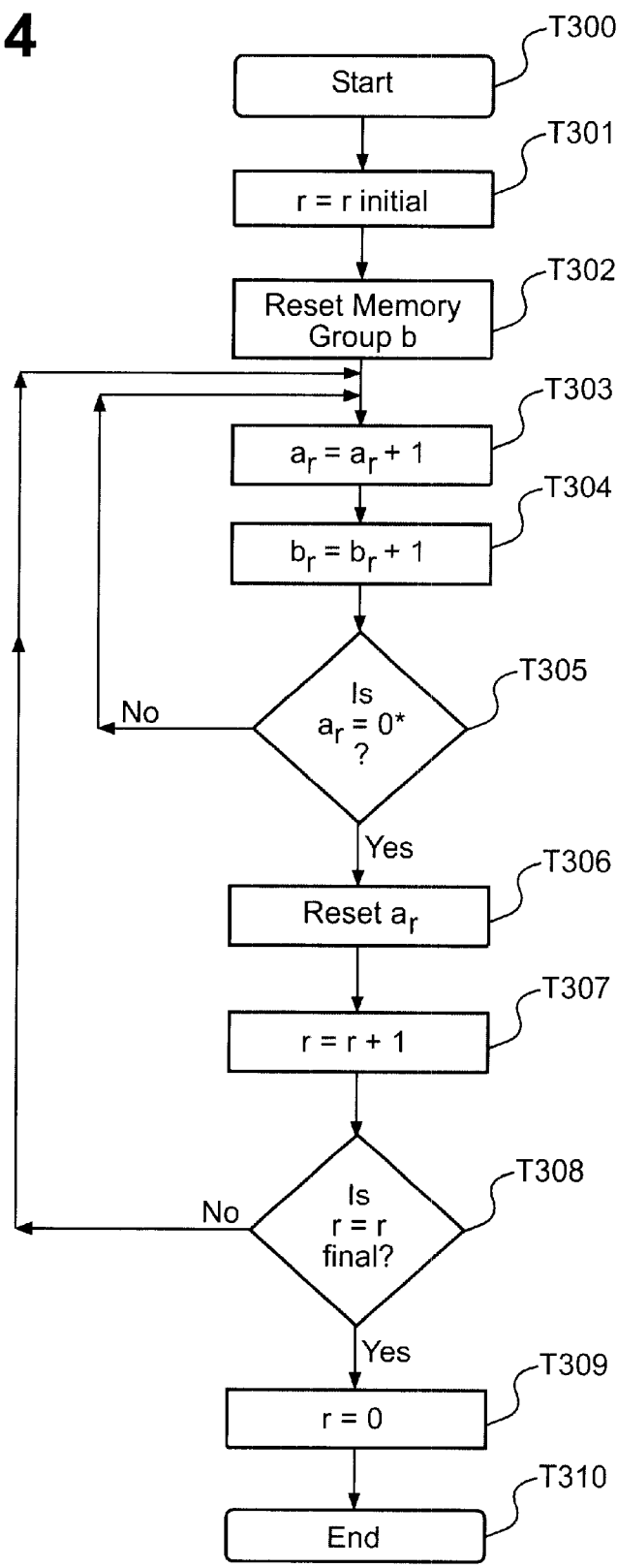
FIG. 4 shows steps in the method HALFCOPY_1 that may be used to compute the complement of a number. In this embodiment, the complement of a number in location a is provided to location b.

In HALFCOPY_1, it is recognized that the set state of a register is not a programming state and the complement of "0" is chosen to be the set state. This choice follows logically from the fact that the set state is one programming pulse higher in energy than the last programming state of a register and therefore may be viewed in this sense as being equal to the base of the arithmetic system. In a base 10 system, for example, the last (tenth) programming state corresponds to a "9" and is reached by applying nine programming pulses to the reset state of the register. Application of a tenth programming pulse transforms the register to its set state. If a register in a base 10 system has a "0" stored in it and ten programming pulses are applied, the register is converted to its set state. Thus, even though the set state is formally not a programming state, it may be viewed as corresponding to a "10" for the purposes of computing the complement of a number. The preceding statement holds for all base systems. In the following discussion, we hereinafter refer to the set state as "0*" rather than "10" to reinforce the notion that the complement of "0" may be recorded in a single register, rather than in two registers. Under this convention, the complement of "907" in base 10 is "10*3". With this convention, it is evident that a number and its complement may be stored in the same number of registers. The method HALFCOPY_1 is presented in FIG. 4 herein. HALFCOPY_1 has been designed for embodiments in which the reset state is chosen as the programming state to which the value zero has been assigned. The notation HALFCOPY_1(b;a) implies that HALFCOPY_1 is applied to the entry stored in memory group a to produce an output in memory group b. In other words, the complement of the number stored in memory group a is written to memory group b. The memory group b may be referred to as the destination memory cell. The method starts at step T300. If the input data value is not stored in memory group a, it may be stored during the start step. Programming states, programming intervals and assignment of numerical values may also be completed in step T300. Storing may include providing energy sufficient to transform a phase change material to the programming state associated with a number being stored. Step T301 initializes the counting register. This initialization process has been described in the resetting algorithm presented hereinabove and the same considerations concerning the values of $r_{initial}$ and $r_{final}$ apply. Algorithms or processes producing the same effect as the reset method described hereinabove may also be used in step T301. In step T302, memory group b is reset. Memory group b may be reset by the resetting method described in FIGS. 2 or 3 herein or by an equivalent method. Upon completion of step T302, all registers of memory group b are in their reset state and store zeroes.

Steps T303, T304, and T305 form an iterative loop that corresponds to the basic processing steps of the method. As indicated hereinabove, computation of the complement of a number requires a register by register subtraction of the digit stored in each register from the base of the arithmetic system. The result of the subtraction process for each register corresponds to the number of programming pulses required to convert the register to its set state. In a base 10 system, for example, four programming pulses are required to convert a register containing a "6" to its set state and four is the complement of "6". The key to computing the complement of a number, therefore, is to keep track of the number of programming pulses required to convert each register to its set state. As indicated in the discussing of the resetting method hereinabove, it is preferable to apply the method only to registers containing non-leading zeroes. This objective may be accomplished by appropriately setting $r_{initial}$, as described hereinabove.

Steps T303, T304, and T305 provide a loop that records the number of programming pulses required to convert the register associated with the current value of r to its set state. In step T303, the register of memory group a associated with the current value of r is incremented by one. In step T304, the corresponding register of memory group b is incremented by one. Memory group b thereby keeps track of the number of programming pulses applied to memory group a. Step T305 queries whether the register $a_r$ has reached its terminal state. If it has not, the method loops back through steps T303 and T304 and increments $a_r$ and $b_r$ by one again. The loop continues until $a_r$ reaches its terminal state. At this point, the register $a_r$ is in its set state and the register $b_r$ is in the programming state corresponding to the number of programming pulses applied to the register $a_r$ to transform it to its set state. The register $b_r$ therefore stores the complement of the digit originally stored in the register $a_r$.

Step T306 is an optional step and is used, if desired, to reset the register $a_r$. At this point in the method, the complement of the register $a_r$ associated with the current value of r has been stored in register $b_r$. Completion of the determination of the complement requires repeating the processing loop for all registers of memory group a. In step T307, the value of r is incremented by one to signify a shift of the counting register to the next register. Step T308 queries whether the counting register index r has reached its final value. If it has not, the method returns to step T303 and completes the loop defined by steps T303, T304, and T305 for a new register. Upon conclusion of this loop, another register of memory group a is in its set state and the complement of the number original stored in that register is recorded in the corresponding register of memory group b. Steps T306 and T307 are completed as described hereinabove and the method continues to step T308 to test once again whether the counting register is in its terminal state. If it is not, the method returns to step T303 and the next register is processed. Once all registers have been processed, memory group b contains the complement of the original number stored in memory group a and memory group a is reset and, if desired, becomes available for other processing. At this point, the method proceeds to the optional step T309 to reset the counting register. It is generally preferable to reset the counting register to make it available for other processing. The method ends at step T310. Reading of output may be completed in step T310.

Figure 5:
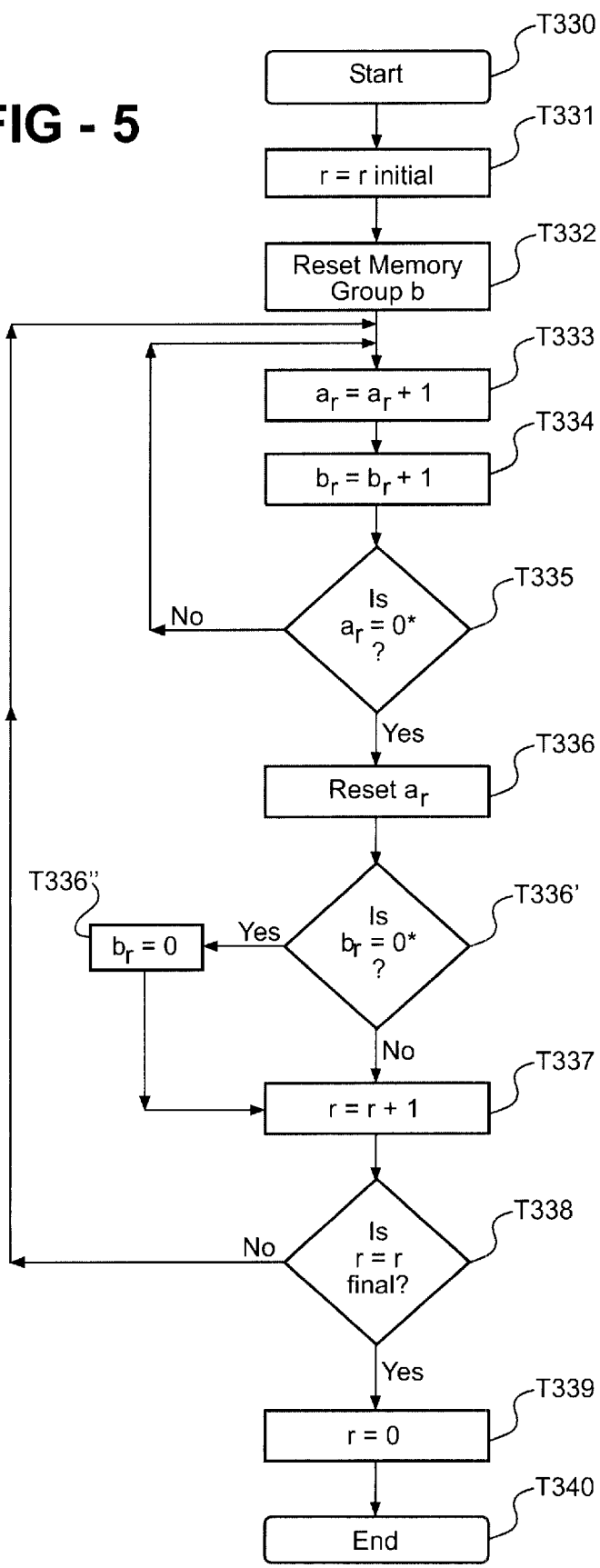
FIG. 5 shows steps in the method HALFCOPY_2 that may be used to compute the complement of a number. In this embodiment, the complement of a number in location a is provided to location b.

HALFCOPY_2 is similar to HALFCOPY_1 and differs in its convention for the treatment of the complement of a non-leading zero. Like HALFCOPY_1, HALFCOPY_2 presumes that the reset state is the programming state associated with zero. In HALFCOPY_2, the complement of a non-leading zero is selected to be zero. In other words, a non-leading zero has itself as a complement. If the number "907" in base 10 is input, HALFCOPY_2 returns "103" as the complement. HALFCOPY_2 is presented in FIG. 5 herein. Most of the steps of HALFCOPY_2 correspond to steps described hereinabove for HALFCOPY_1. Corresponding steps are offset by 30 in the value of the number used in the label of the steps. Step T330, for example, corresponds to step T300; step T331 corresponds to step T301 etc. The steps T336' and T336" do not have corresponding steps in HALFCOPY_1. They represent the steps used to reset the registers of the destination memory group b that exist in their set state 0* when the method reaches step T336'. Step T336' queries whether the register $b_r$ associated with the current value of r is in its set state. As in the analogous case of $a_r$, the test can be performed by measuring the resistance or some other property characteristic of the set state. If the register $b_r$ is not in its set state, the method continues to step T337 and is otherwise analogous to HALFCOPY_1.

If the register $a_r$ initially stores a "0", the register $b_r$ will be transformed to the set state 0* in the same iteration of the loop defined by steps T333, T334 and T335 that $a_r$ is transformed to the set state 0*. When this situation occurs and the method proceeds from step T335 to step T336, both $a_r$ and $b_r$ are in the set state 0*. In step T336, the register $a_r$ is reset. As in the corresponding step of HALFCOPY_1, step T336 is optional, but preferable. If the register $b_r$ is in the set state 0*, the method continues to step T336" and resets $b_r$ to zero in conformity with the convention adopted for the treatment of the complement of non-leading zeroes in HALFCOPY_2. The method proceeds to step T337 and is otherwise analogous to HALFCOPY_1.

Methods equivalent to HALFCOPY_2 may be developed as well and are included within the scope of the instant invention. Instead of including steps T336' and T336", for example, additional steps may be placed between steps T332 and T333 to provide compliance with the convention that non-leading zeroes are treated as their own complements. A step T332' could be added which queries whether $a_r$ is equal to zero. If it is not, the method would continue to step T333 and would otherwise be analogous to HALFCOPY_1. If step T332' shows that $a_r$ is zero, then it is not necessary to act on the corresponding register $b_r$ since it would already store the value "0" and would already represent the desired complement. In this situation, the method could directly loop to step T337 and bypass the intermediate steps.

Although HALFCOPY_1 and HALFCOPY_2 are written for one destination register, simple adaptations permit multiple destination registers. The method HALFCOPY_1 (c,b;a), for example, would store the complement of the number present in memory group a to destination memory groups b and c. Such a method may be implemented by including a step T304' which executes $c_r = c_r + 1$ immediately following step T304.

As indicated hereinabove, embodiments in which $r_{initial}$ is set to exclude the processing of leading zeroes are preferable. Embodiments in which leading zeroes are processed also fall within the scope of the instant invention. In such embodiments, leading zeroes may be processed according to either of the conventions described hereinabove for the treatment of the complement of non-leading zeroes.

Copy

The function of a copying algorithm is to copy the contents of one memory group to another memory group. In general, it should be possible to directly read a memory group and duplicate its contents in another memory group. The feasibility of such a direct copying method depends on the ease with which a memory group can be read. Direct copying is possible with the phase change material through the instant computing methods. Direct copying requires the reading of a memory element or register of one memory group and the writing of the result in a memory element or register of another memory group. Reading and writing of the multistate phase change material used by the instant computing methods has been described hereinabove.

Another method of copying can be devised using the HALFCOPY methods described hereinabove. The HALF-COPY methods return the complement of a number as output. Application of HALFCOPY to the complement of a number returns the number itself. In other words, two successive applications of HALFCOPY return the original number input as output. As an example, consider the number "543" in a base 10 arithmetic system. The application of either HALFCOPY_1 or HALFCOPY_2 to "543" in a base 10 arithmetic system returns "567". If either HALFCOPY_1 or HALFCOPY_2 is subsequently applied to the output result "567", the number "543" is returned. Two successive applications of HALFCOPY_1 or HALFCOPY_2, successive applications of HALFCOPY_1 and HALFCOPY_2 in either order, or analogous applications of algorithms producing the same effect as HALFCOPY_1 or HALFCOPY_2 may be used to construct a copying method.

Figure 6:
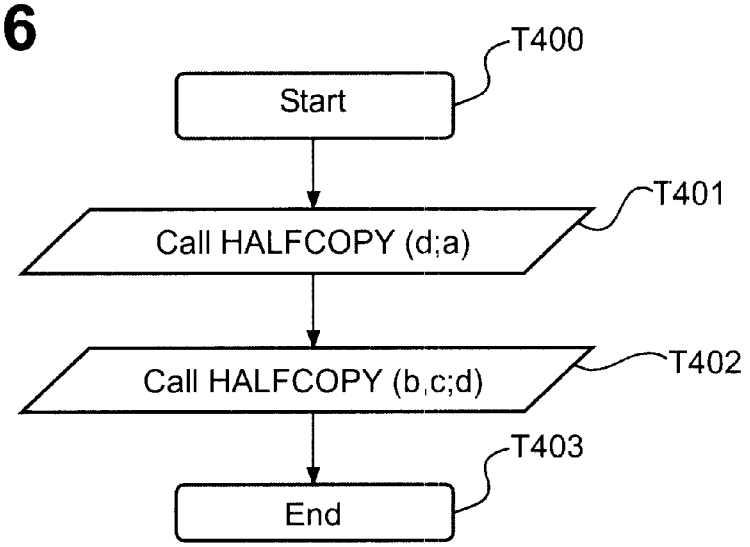
FIG. 6 shows steps in a method of copying denoted COPY_1. In this embodiment, the number stored in location a is copied to locations b and c.

One example of a copying method is presented in FIG. 6 herein. COPY(b,c;a) copies the contents of memory group a to destination memory groups b and c. The method starts at step T400. If not already stored, the input data value may be stored in memory group a in the start step. Programming states, programming intervals and assignment of numerical values may also be completed in step T400. Storing may include providing energy sufficient to transform a phase change material to the programming state associated with a number being stored. In each of steps T401 and T402, a HALFCOPY method is called and executed. The method called may be HALFCOPY_1, HALFCOPY_2 or an equivalent thereof. Step T401 takes the data of memory group a as input and provides its complement to memory group d. Step T402 takes the data in memory group d and provides its complement to memory groups b and c. The method ends at step T403. Reading of output may also be completed in step T403.

The effect of COPY(b,c;a) is to copy the contents of memory group a to memory groups b and c. Analogous methods may be written if it is desired to copy to more than two destination memory cells. If only one destination register is included, the method has the effect of moving the contents of one memory group to another memory group. COPY(b;a), for example, copies the contents of memory group a to memory group b. Since it is transformed, memory group a does not contain its original contents upon completion of the method. Thus, COPY(b;a) has the effect of moving the contents of memory group a to memory group b. If it is desired to retain the original data present in memory group a, memory group a may be included among the destination registers. COPY(a,b;a), for example, provides the contents of memory group a to destination memory group b and restores memory group a to its original condition.

When non-leading zeroes are present in the number to be copied, it is preferable to call HALFCOPY_2 in steps T401 and T402. If a non-leading zero is processed through HALFCOPY_2, a zero is returned. Two applications of HALFCOPY_2 to a non-leading zero present in an original number to be copied, therefore returns the non-leading zero. Consider as an example the number "907" in base 10. One application of HALFCOPY_2 returns the number "103". A second application returns the number "907", a true copy as normally desired in a copying algorithm.

COPY methods based on other combinations of HALFCOPY_1 and HALFCOPY_2 return results other than a true copy and require additional processing steps if a true copy is desired. Consider the use of HALFCOPY_1 in step T401 and HALFCOPY_1 in step T402. When "907" in base 10 is input, step T401 returns "90*3". When this result is used as input into step T402, "917" is returned. In order to obtain a true copy, it is necessary to reset the 0* returned after step T401 prior to executing step T402 and to do likewise after executing step T402. The use of HALFCOPY_1 in step T401 and HALFCOPY_2 in step T402 also returns "917" when "907" is input. The use of HALFCOPY_2 in step T401 and HALFCOPY_1 in step T402 returns "90*7" when "907" is input. Additional steps may be added to COPY to convert these outputs to true copies.

Add

The function of an addition algorithm is to take two numbers as inputs and return their sum as an output. In its most basic form, addition in the context of the instant invention may be viewed in terms of the energy added to the phase change material. Since the states of the phase change material are ordered or distinguishable in terms of energy relative to the reset state, the total energy added to the reset state of the phase change material or the total energy possessed by the phase change material relative to the reset state may be used as a basis for defining a mechanism of addition.

One way of adding exploits the additive nature of the energy of states of the phase change material relative to the reset state. In this method, the phase change material is first transformed to its reset state and energy characteristic of the numbers to be added is applied. Applying a first amount of energy proportional to a first number, for example, transforms the phase change material to a state characteristic of the first number. Subsequent application of a second amount of energy proportional to a second number transforms the phase change material to a state characteristic of the sum of the first and second numbers. The energy in this method may be applied directly to the phase change material or to memory groups sub-divided within the phase change material or to registers contained within memory groups. The energy characteristic of a number may be proportional to the number or may correspond to an energy sufficient to transform the phase change material into the programming state associated with the numerical value of the number.

The phase change material also is not required to initially be present in its reset state because relative position within the energy interval between the reset state and set state may be used to signify a number. A state, for example, located halfway in energy between the reset state and set state may correspond to half of the maximum number storable in the phase change material. Such a state may be distinguished by the amount of energy required to set the phase change material. Since the energy interval between the reset state and set state is fixed for a particular chemical composition, energy relative to the set state may be used as a quantity characteristic of a number stored in a phase change material. Similarly, when programming states are defined, the value of a number stored in a phase change material may be obtained by determining the number of programming intervals required to set the phase change material and subtracting this number from the maximum numerical value storable in the set of programming states.

The convenient determination of the complement of a number provides another basis of a method for adding numbers stored in multistate memory groups. The addition operation may follow more naturally from the complement of a number than from a number itself. The reason for this possibility is that the complement of a number requires application of programming pulses in an amount equal to the number itself in order to reach the set state. Consider a single digit number such as "4" in a base 10 arithmetic system as an example. The complement of "4" in a base 10 arithmetic system is "6" and "6" requires 4 programming pulses to reach the readily detectable set state 0*. Thus, if we convert a "4" into its complement "6" and proceed to transform the "6" into its set state, we have achieved a reliable way of incrementing the contents of a register by four. A basic strategy for adding two numbers is thus seen to be to first convert the first addend to its complement and then to apply programming pulses one at a time and in equal numbers to the complement and the second addend until the complement transforms into its low resistance set state. When this transformation occurs, we will have added to the second addend a number of programming pulses equal to the first addend. This is a desirable strategy for adding because the set state of the complement of the first addend is a readily detectable state.

The basic strategy of addition may be illustrated as follows. Consider as an example the addition of a first addend "4" to a second addend "5" in a base 10 arithmetic system. Conversion of the addend "4" to its complement produces a "6". Transformation of the "6" into its set state requires four programming pulses. Incrementing the second addend "5" in a one-to-one fashion as the complement "6" is transformed to its set state implies that four programming pulses are added to the second addend "5". The second addend "5" is thereby converted to a programming state corresponding to a "9" and the addends "4" and "5" have thus been added.

Figure 7:
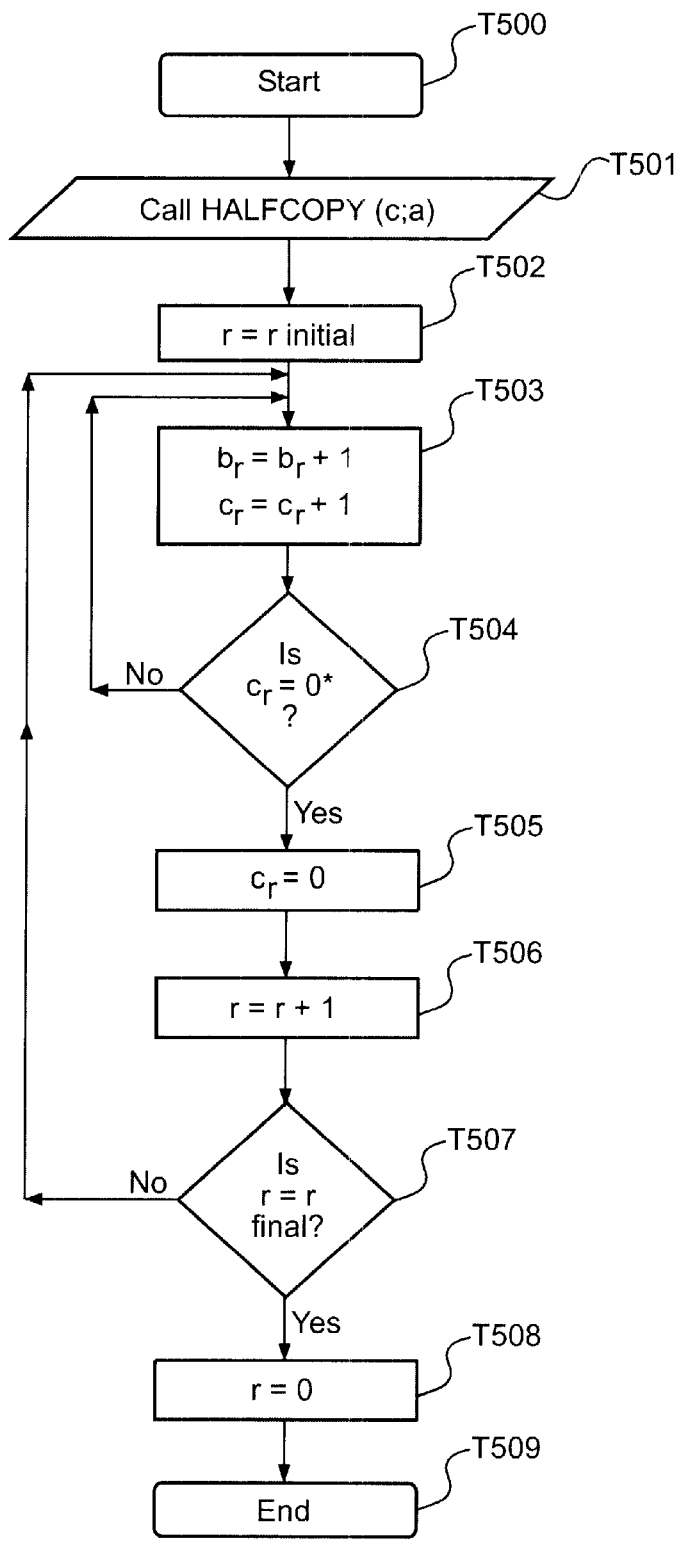
FIG. 7 shows steps in a method of adding denoted BASIC ADD. In this embodiment, the sum of numbers in locations a and b is provided.

FIG. 7 herein provides a basic computing method for addition. The algorithm of FIG. 7 is referred to as Basic Add to distinguish it from a more robust method presented hereinbelow in FIG. 8. BASIC ADD(a,b;a+b) in FIG. 7 takes the numbers a and b as input and provides the sum a+b as output. The numbers a and b are stored in memory groups a and b and may be single digit numbers or multidigit numbers contained in a series of registers associated with memory groups a and b. As written, the method provides the output a+b to the memory group originally storing the addend b. Hence, memory group b is the destination memory group for the method shown in FIG. 7. Equivalent methods in which the output is stored in memory group a or a memory group other than memory groups a or b may also be written.

The algorithm starts with step T500. If not already stored, the input data values a and b may be stored in the start step. Programming states, programming intervals and assignment of numerical values may also be completed in step T500. Storing may include providing energy sufficient to transform a phase change material to the programming state associated with a number being stored. In step T501, a HALFCOPY method is called. The purpose of step T501 is to compute the complement of the number stored in memory group a. The complement is created and stored in memory group c. HALFCOPY_1, HALFCOPY_2 or equivalents thereof may be used in step T501 subject to considerations related to non-leading zeroes described hereinbelow.

In step T502, the counting register is initialized. It is preferable for the counting register to be initialized in such a way that the final state of the counting register is the set state of the counting register. It is preferable for each state of the counting register to correspond to a different digit or register of the numbers stored in the memory groups being processed by the algorithm. Progress from one digit to the next within a memory group is marked by incrementing the counting register by one through the addition of a programming pulse to the counting register. Once all digits have been processed, it is preferable for the addition of one further programming pulse to transform the counting register to its set state. It is preferable for the counting register to be initialized so that this result is achieved. When adding two four digit addends, for example, the counting register is preferably initialized so that application of four programming pulses transforms the counting register to its set state. If the addends comprise a different number of non-leading zero digits, the addend with the larger number of non-leading zero digits establishes the initialization condition for the counting register. When adding a three digit addend to a two digit addend, for example, the three digit addend may be used to determine the initialization of the counting register and $r_{initial}$ may be set accordingly.

Steps T503 and T504 define the basic processing loop. In step T503, the registers of memory groups b and c associated with the current value of the counting register are incremented by one. As discussed hereinabove, the strategy behind this loop is to increment the complement stored in memory group c until it reaches its set state and to increment the registers in memory cell b in step with the incrementing of the registers of memory group c. When a register of memory group c is incremented to its set state, the corresponding register of memory group b contains the value required for the sum of a and b. Step T504 tests whether the current register of memory group c has reached its set state. The set state is denoted "0*" in step T504. If the set state has not been reached, the loop returns to step T503 and continues until the set state is reached. Once the set state is reached, the method proceeds to step T505 which effects a reset of the register of memory group c that has been transformed to its set state. Step T505 is an optional step. Step T506 increments the counting register by one to signify a progression to the next digit. Step T507 tests whether the counting register has reached its final state. As indicated hereinabove, it is preferable for $r_{final}$ to correspond to the set state of the counting register. If the counting register is not in its final state, the method returns to step T503 and processes another digit or register. The processing continues through all digits at which point the counting register is incremented to its final state. The method continues to step T508 to reset the counting register and concludes in step T509. Step T508 is optional, but preferable and reading of output may be completed in step T509.

BASIC ADD presented in FIG. 7 herein effectively executes a simple addition. Two circumstances that occur frequently during addition have not been specifically addressed in Basic Add. First, addends containing non-leading zeroes have not been considered and second, the need to carry over from one place value to the next higher place value has not been included. These circumstances are now considered.

The presence of non-leading zeroes in addends requires special consideration within the addition strategy developed above because the strategy involves the processing of the complement of one of the addends. As described hereinabove, methods such as HALFCOPY_1 and HALFCOPY_2 may be used to produce the complement of a number. These methods and their equivalents adopt conventions with respect to the treatment of non-leading zeroes. Two conventions have been discussed. In HALFCOPY_1, a non-leading zero is transformed into the low resistance set state 0* and in HALFCOPY_2, a non-leading zero is transformed into itself. Addition methods based on both conventions may be developed within the scope of the instant invention. Since the low resistance set state 0* is more conveniently detected than the high resistance 0 state, it is preferable to develop an addition method in which the complement of 0 is 0*. An example of such a method is presented in FIG. 8 herein where HALFCOPY_1 is incorporated.

The need to carryover arises when the sum of two digits exceeds or equals the base of the arithmetic system. The adding of 4 and 7 in base 10, for example, produces 11 and requires a carryover to provide a second digit. Consequently, an addition method capable of executing carryover necessarily must recognize when carryover is required and include a provision for incrementing a higher place value register in a memory group by one. An example of such a method algorithm is presented in FIG. 8 and FIG. 8A herein.

Figure 8A:
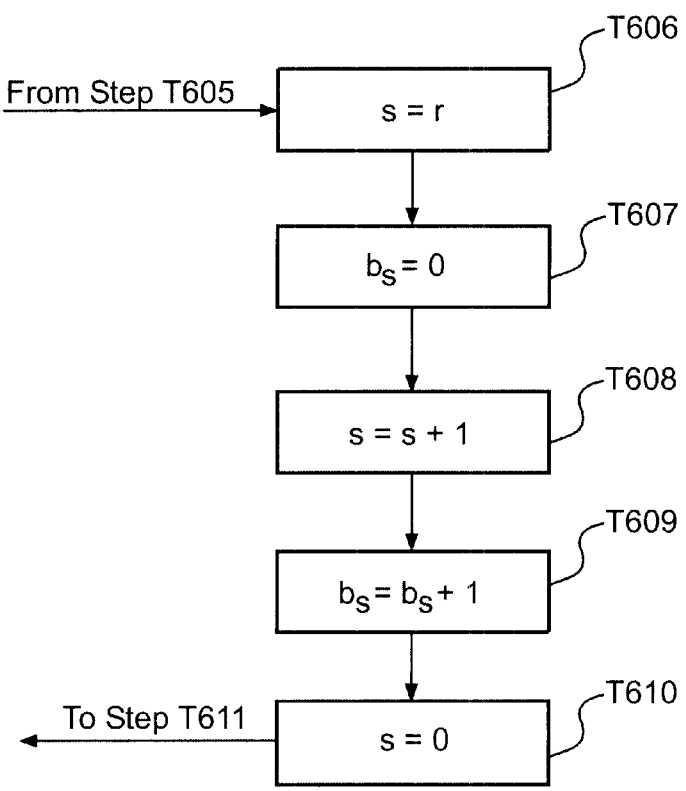

ADD(a,b;a+b) shown in FIGS. 8 and 8A is a comprehensive addition method suitable for use with multistate phase change memory groups. Steps T600, T601, and T602 are analogous to steps T500, T501, and T502 described hereinabove. In step T601, HALFCOPY_1 has been included and is used to write the complement of addend a in memory group c. It is equivalently possible to work with the complement of addend b or to write the complement in other or several memory groups.

The loop comprising steps T603, T603', and T603" does not appear in the BASIC ADD method of FIG. 7 and has been inserted to account for the possible presence of non-leading zero digits in the addends. In the example shown in FIGS. 8 and 8A, non-leading zeroes in the addend a are relevant since the complement of a is determined and processed by the method. When HALFCOPY_1 is called, a non-leading zero in the addend a is converted to the readily detectable state 0*. Step T603 is included to test for the presence of 0* in the register $c_r$ associated with the current value of the counting register index r. If the register $c_r$ is not in the state 0*, the method bypasses steps T603' and T603" and proceeds to step T604. If, however, the register $c_r$ is in the state 0*, we know that the addend a contained a non-leading zero and the method proceeds to steps T603' and T603". Steps T603' and T603" are predicated on the fact that if a non-leading zero is present in the addend a, then it has no effect on the corresponding digit in the addend b. Addition of zero to a digit of addend b has no effect on that digit. The effect of steps T603' and T603" accordingly is to simply reset the 0* state of register $c_r$ and increment the register counter by one so that the next digit is pointed at. The loop comprising steps T603, T603', and T603" is repeated until a register in memory group c that is not in the state 0* is encountered. The method can thus properly process addends such as 900 that contain more than one non-leading zero in adjacent registers.

Steps T603, T603', and T603" provide a computationally efficient way to handle non-leading zeroes. Use of a complement producing method such as HALFCOPY_2 that converts non-leading zeroes into 0 rather than 0* are not as efficient because the 0 state is not as readily detected as the 0* state. Further processing steps would be necessary to discover the presence of a non-leading zero in the addend a. For example, an incrementing step such as T604 could be used where the signature of a non-leading zero would be the conversion of registers $b_r$ and $c_r$ in the same processing step to the state 0*. This signature could be detected and a suitable computing method developed. Such a method is less preferable than one in which non-leading zeroes converted to the state 0* when determining the complement.

Step T604 of ADD is an incrementing step analogous to step T503 of BASIC ADD. Analogous to BASIC ADD, the strategy of incrementing corresponding registers of memory groups b and c until the register or reaches its set state is also used in ADD. In contrast to BASIC ADD, however, ADD recognizes and accommodates carryover. The test for whether a carryover process is necessary is made at step T605. Carryover necessarily implies that the register $b_r$ in the destination memory group b is incremented to the state 0* prior to or in the same step that the register $c_r$ is incremented to the state 0*. Hence, step T605 tests for whether the register $b_r$ has reached the state 0*. If $b_r$ is not in the state 0*, the method proceeds to step T611 which is analogous to step T504 in the BASIC ADD method presented in FIG. 7 hereinabove. Step T611 tests whether the register $c_r$ has been incremented to the state 0*. If it has not, the method returns to step T604 to begin another iteration using the current register. If the register $c_r$ is in the state 0*, the method proceeds to step T612 where $c_r$ is reset. Step T612 is an optional, but preferable step. In step T613, the register counter is incremented by one and in step T614, a test is made to determine whether the counting register has reached its final state. If it has, the method proceeds to the optional, but preferable reset step 615 and ends at step T616. Reading of output may be completed in step T616. If the register counter is not in its final state in step T614, the method returns to step T603 for processing of the next register.

ADD recognizes the need for carryover in step T605 and implements a carryover in steps T606, T607, T608, T609, and T610 shown in FIG. 8A herein. Step T606 is executed upon the incrementing of the destination register $b_r$ to the set state 0*. Step T606 introduces a second counting register s and sets its initial value to the current value of the first counting register r. A second counting register permits the method to point at and process different registers within a memory cell. In step T607, the register of memory cell b in the set state 0* is reset to 0. Since the counting registers r and s point at the same register of memory group b at this point in the method, step T607 may also be written as $b_r=0$. It is also possible to reset $b_r$ prior to introducing counting register s. In step T608, the counting register s is incremented by one so that it points at the register one place value higher than the register pointed at by counting register r. This step presages the carrying over that occurs in step T609. In step T609, the register pointed at by s is incremented by one as required for carryover in addition. Step T6 10 resets counting register s so that it may be used in later iterations for other registers, if necessary. Upon completion of step T610, the method proceeds to step T611 and continues as previously described.

When carryover is necessary, it is preferable for the register counter to proceed in the direction of increasing place value within the memory groups of the addends or complements thereof. Accordingly, it is preferable for the initial value of the counting register to correspond to the register of a memory group or complement having the smallest place value. Generally, this smallest place value register corresponds to the "1's" digit of a multidigit number. Incrementing the counting register thus corresponds to progressing in the direction of increasing place value so that the "1's" digit is followed by the "10's" digit etc. during execution of the method. A correct accounting of place value is required to properly effect carryover.

Subtraction

The function of a subtraction method is to compute the difference between two numbers. A subtraction method presented herein recognizes the convenience associated with computing the difference between two numbers. Specifically, the difference between two numbers remains constant when a common number is added to each of the two numbers. Consider as an example the difference between 354 and 123 in a base 10 arithmetic system. This difference corresponds to the subtraction 354–123. If we add a common number to both 354 and 123, we change the two numbers, but we do not change the difference between the two numbers. Thus, 354–123 is the same as 355–124 is the same as 455–224 etc. In the instant invention, the act of adding a common number to each of two numbers being subtracted may be realized by adding a common energy to a memory group, register, or volume of phase change material storing the numbers. The addition of setting energy, for example, to a memory group storing the number a in the subtraction b–a and subsequently adding this setting energy to a memory group storing the number b may be used to transform memory group b to a state characteristic of or corresponding to the difference b–a.

Figure 9:
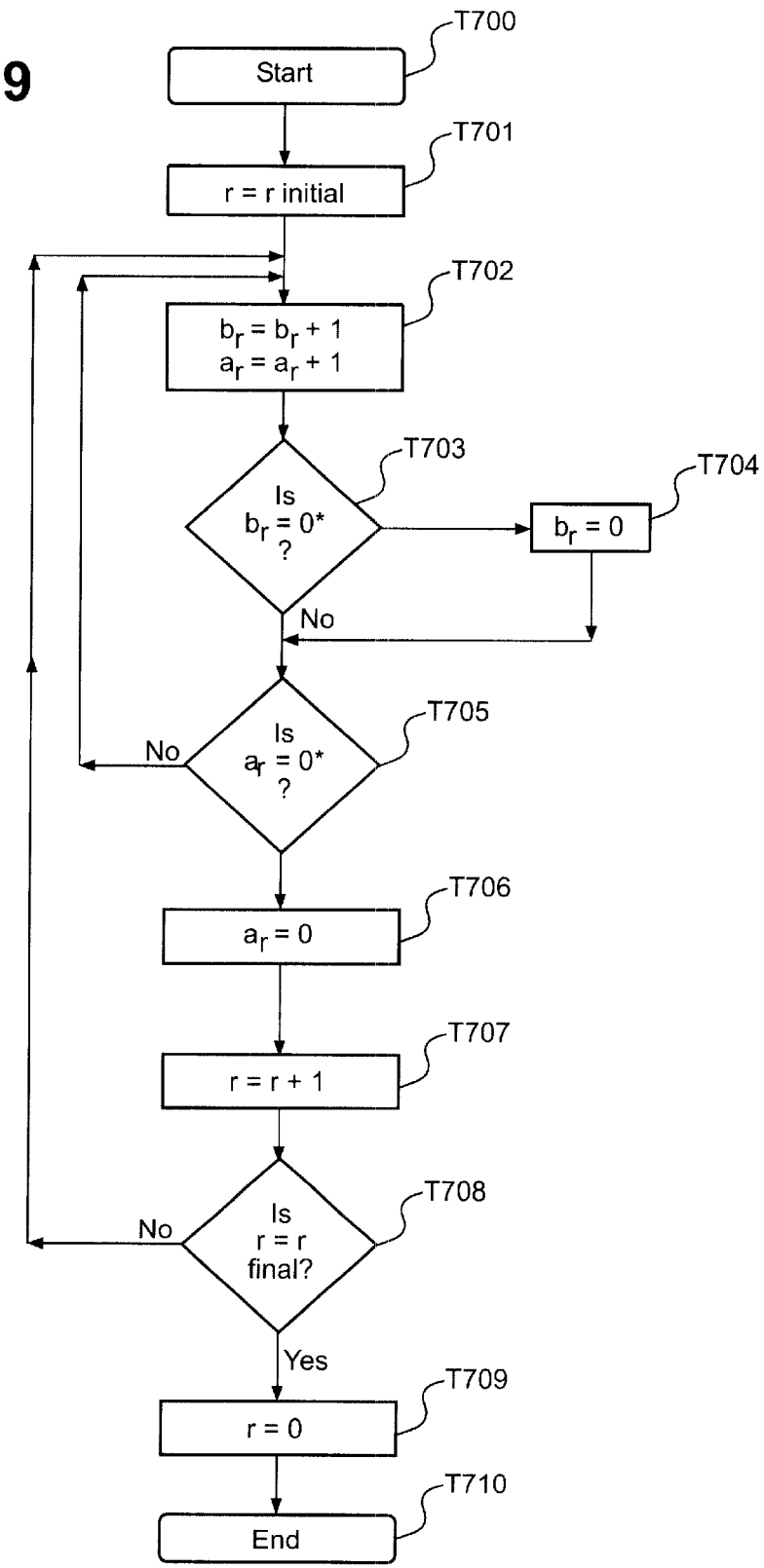
FIG. 9 shows steps in a method of subtracting denoted BASIC SUBTRACT. In this embodiment, the difference of numbers in locations b and a is provided.
Figure 10:
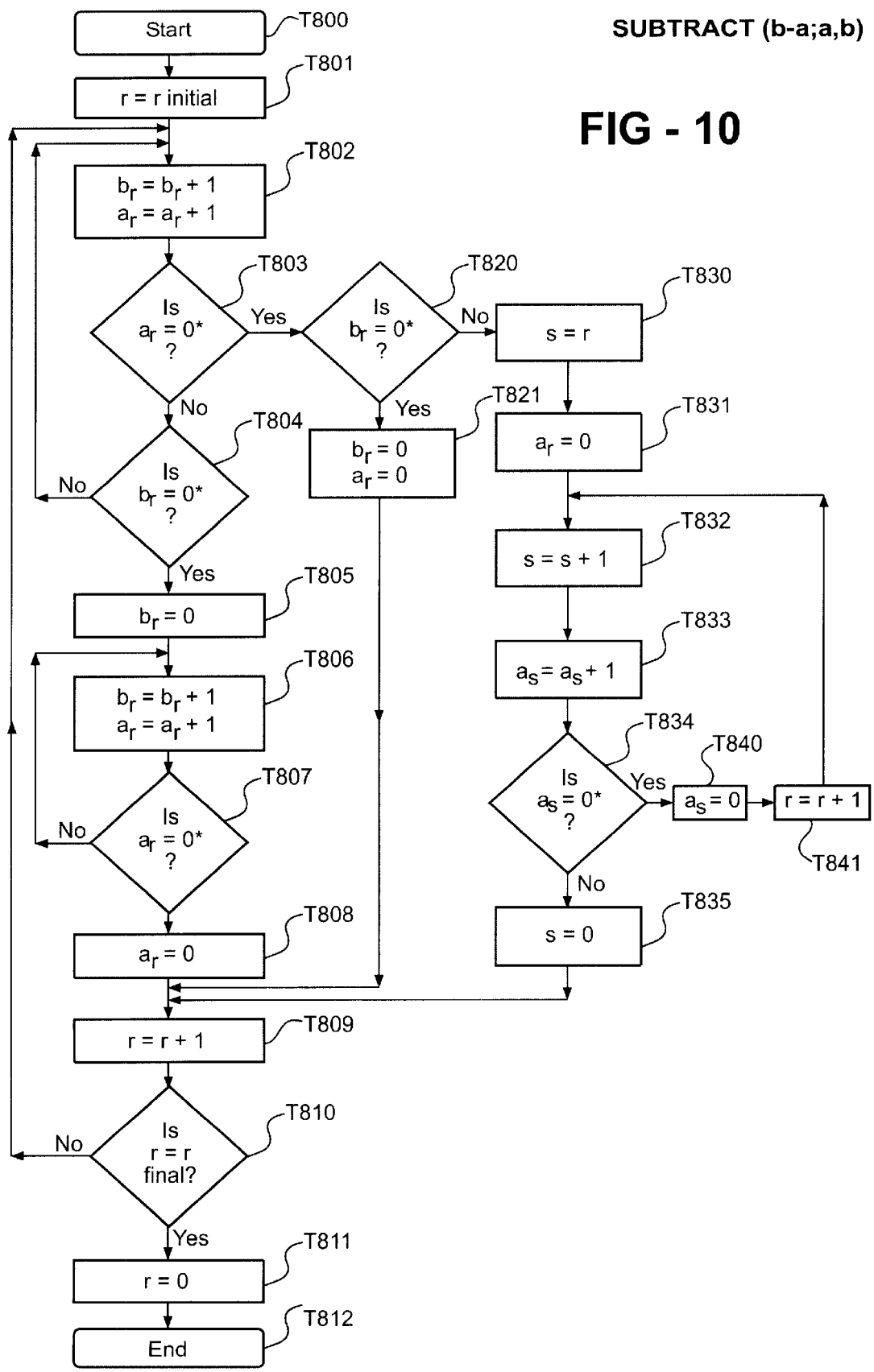
FIG. 10 shows steps in a method of subtracting denoted SUBTRACT. In this embodiment, the difference of numbers in locations b and a is provided.

The methods BASIC SUBTRACT and SUBTRACT presented in FIGS. 9 and 10 herein are based on a strategy in which the number being subtracted (the second number a in the general subtraction b–a) is incremented register by register until each register is transformed into its low resistance 0* state. By incrementing corresponding registers of the number from which the subtraction occurs (the first number b in the general subtraction b–a). analogously, the first number may be converted into a number that equals the difference between the two original numbers. The subtraction 354–123 may be used as an illustration. If we start with the lowest place value digit and follow the strategy of converting the register in the second number to the low resistance 0* state, it would be necessary to increment each of the two digits by 7 (for example, through the addition of 7 programming pulses) to convert the original subtraction to a new subtraction that maintains the original difference. Strictly speaking, adding 7 to 3 gives 10 and adding 7 to 4 gives 11. Since we can subtract 10 from both results without affecting the difference, incrementing the lowest place value digit of both numbers by 7 has the effect of converting the original subtraction 354–123 to the subtraction 351–120. Continuing to the next highest place value digit and repeating the strategy further transforms the subtraction from 351–120 to 331–100. Repeating for the final digit provides 231–000. The net effect of the indicated register by register operations is a conversion of the original subtraction 354–123 to the more convenient subtraction 231–000 which readily reveals the desired difference.

BASIC SUBTRACT depicted in FIG. 9 herein implements this register by register strategy for subtraction. For input data values a and b, the algorithm computes the difference b–a. The algorithm starts with step T700. If not already present, input data values a and b, which may be multidigit numbers, may be stored in memory groups a and b, respectively, in step T700. Programming states, programming intervals and assignment of numerical values may also be completed in step T700. Storing may include providing energy sufficient to transform a phase change material to the programming state associated with a number being stored. The counting register r is initialized as described hereinabove in other algorithms in step T701. As described hereinabove, the value of the counting register signifies designating corresponding registers of the memory groups being processed where corresponding registers are registers corresponding to the same place value. In step T702, the registers of memory groups a and b being pointed at by the counting register are incremented. This step includes the concept of simultaneously incrementing digits corresponding to the same place value in stepwise fashion described hereinabove. Step T703 tests whether the register $b_r$ has been incremented to its set state. If $b_r$ is in its set state, the method continues to step T704 and resets $b_r$ to zero so that further incrementing can occur. An objective of the method is to increment until the register $a_r$ is in its set state. Step T705 tests for this condition. If $a_r$ is in a state other than its set state, the method returns to step T702 and executes another incrementing iteration. When $a_r$ has been incremented to its set state, the value stored in the corresponding register $b_r$ represents a digit in the desired difference b−a. The method continues to the optional reset step T706 and then to step T707 where the counting register is incremented to signify commencement of the processing of another set of corresponding digits of memory groups a and b or, if the counting register has been incremented to its final state, to signify termination of the method. Step T708 tests whether the counting register has reached its final state. If it has not, the method returns to step T702 to process another set of corresponding registers of memory groups a and b according to the objectives of the method. If the counting register is in its final state in step T708, the method proceeds to an optional counter reset step T709 and terminates in step T710. Reading of output may be completed in step T710.

Another subtraction method, SUBTRACT(b−a; a, b) is presented in FIG. 10 herein. This method operates on input data values a and b stored in memory groups a and b, respectively, and returns the difference b−a and may be more versatile than BASIC SUBTRACT described hereinabove. The main thread, steps T800–T812, of SUBTRACT(b−a; a, b) is similar to steps T700–T710 described hereinabove. SUBTRACT(b−a; a, b) includes two sideloops, one defined by steps T820–T821 and one defined by steps T830–T835, T840 and T841, to effect a borrowing process should it become necessary. Borrowing refers to utilizing a contribution from the next higher place valued digit when subtracting digits of a particular place value. In the base 10 subtraction 95−39, for example, borrowing is necessary for the lowest place value digit because the "9" exceeds the "5" in value. Borrowing occurs by lowering the value of the next highest place value digit of the first subtractand by one, converting the one to its equivalent in the lower place value, and adding the converted place value to the lower place value digit. In the foregoing example, the "9" of 95 is reduced by "1" to provide an "8", the "1" in place value 10 is converted to a 10 in place value 1 and is added to the "5" to provide a "15" in the lowest place value slot of the first subtractand. Subtraction continues by subtracting the "9" (the digit of the subtractand "39" having a place value of 1) from the "15" to give a "6". The process continues to the next place value digit and further borrowing is implemented if necessary. In the foregoing example, further borrowing is not necessary and the subtraction is completed by subtracting corresponding digits having a place value of 10 (i.e. 8−3) to provide the final answer of "56".

The need for borrowing may be determined by considering three possible scenarios for the relative values of corresponding digits of numbers stored in memory groups a and b. When a digit $b_r$ of memory group b is greater than the corresponding digit $a_r$ of memory group a, the difference $b_r-a_r$ is positive and no borrowing is necessary. When the difference $b_r-a_r$ is negative, borrowing is necessary and when $b_r=a_r$, borrowing may or may not be necessary. The need for borrowing when $b_r=a_r$ may depend on whether borrowing was necessary for digits having lower place value because such borrowing may act to reduce $b_r$ and create the condition $b_r<a_r$ even though the condition may not have been present in the subtraction as originally formulated. In the subtraction 2047−1032, for example, no borrowing would be necessary for the zeroes having place values of 100. In the subtraction 2047−1052, however, borrowing would be necessary.

SUBTRACT(a−a; a, b) accounts for the three possible scenarios for the relative values of corresponding digits $b_r$ and $a_r$. The main thread (steps T800–T812) accounts for the case $b_r>a_r$. The sideloop including steps T820 and T821 accounts for the case $b_r=a_r$ and the sideloop including steps T830–T835, T840 and T841 accounts for the case $b_r<a_r$. Steps T800–T803 are analogous to steps T700–T703 described hereinabove. Step T803 regulates flow of the computation through the main thread and the sideloops. When $b_r>a_r$, the register $b_r$ is incremented to its set state before the corresponding register $a_r$ and the method proceeds exclusively through the "No" branch of step T803. In this situation, steps T802, T803 and T804 are repeated until $b_r$ is incremented to its set state and the method continues to step T805 in which $b_r$ is reset to zero so that further incrementing may occur until the register $a_r$ is transformed to its set state. Step T806 accounts for incrementing after the register $b_r$ has been reset and step T807 tests whether the register $a_r$ has been incremented to its set state. Incrementing occurs until $a_r$ is in its set state and the method then proceeds to the optional step T808 to reset register $a_r$. Since the desired subtraction result corresponds to the contents of memory group b, step T808 is optional.

When $b_r=a_r$; that is, when digits corresponding to the same place value in the original numbers stored in memory groups a and b or when borrowing creates equality of corresponding digits in memory groups a and b; the registers $a_r$ and $b_r$ are incremented to the set state in the same iteration. When this occurs, the method proceeds to step T820 and continues to step T821. Step T820 tests whether the register $b_r$ is in its set state under circumstances when the register $a_r$ has been confirmed in step T803 to be in its set state. When $b_r=a_r$, the method proceeds from step T820 to step T821 where the registers $b_r$ and $a_r$ are reset. The resetting of $a_r$ and $b_r$ is optional. Resetting of $b_r$ may be preferred, however, since the contents of memory group b upon completion of the method correspond to the desired subtraction result and since the reset state formally corresponds to the digit zero in this embodiment. Alternatively, however, within the context of this method, the set state of the register $b_r$ may also be interpreted as the zero digit since the ultimate reading of the reset state requires transforming the reset state to the set state. Upon conclusion of step T821, the method returns to the main thread.

When $b_r<a_r$, borrowing is necessary. In this situation, the register $a_r$ is incremented to its set state before the register $b_r$ and the method proceeds from step T803 to step T820 to step T830, the entry point for a sideloop that implements a borrowing protocol. Step T830 introduces a second counting register s and sets its initial value to the current value of counting register r. Counting register s is independent of counting register r and may be used to point at or designate a register of a memory group different from the one being pointed at by counting register r.

Borrowing requires consideration of corresponding registers one step higher in place value than the register being pointed at in step T830. Two possible strategies for borrowing may be envisioned. In a first strategy, the higher place value digit of memory group b is reduced by one and is compensated by adding 10 (or whatever the value of the base of the arithmetic system being used is) to the register or memory group b being pointed at in step T830. In a second strategy, the higher place value digit of memory group a is incremented by one and is compensated by reducing the register of memory group a being pointed at in step T830 by 10 (or whatever the value of the base of the arithmetic system being used is). Both strategies constitute embodiments of the instant invention. The latter strategy is implemented in the method depicted in FIG. 10 and is described more fully hereinbelow.

At step T830, both counting registers r and s are pointing at the corresponding registers of memory groups a and b which predicated the need for borrowing. The register $a_r$ is in its set state when the method reaches step T830. In step T831, the register $a_r$ is reset. Since the set state is one increment past the programming state corresponding to the maximum number storable, it may be viewed in the context of borrowing as corresponding to the value of the base of the arithmetic system. If the computation is applied to numbers in a base 10 system, for example, the programming state immediately preceding the set state is associated with a "9" and the set state may be viewed as a "10". When viewed in this context, the resetting of register $a_r$ in step T831 may be viewed as reducing the value of $a_r$ by "10". Compensation for this reduction may be effected by incrementing the register having one place value higher than $a_r$ by one. This incrementing occurs in steps T832 and T833. In step T832, the counting register s is incremented by one. Prior to step T832, counting register s was in the same state as counting register a and was pointing at the register a, which was the same as the register $a_r$ that was reset in step T831. The incrementing of counting register s by one in step T832 corresponds to having counting register s point at the register having one place value higher than the register a, that was reset in step T831. In step T833, the register associated with the incremented value of s is incremented by one to complete the borrowing process.

Step T834 accounts for the special case in which the incrementing that occurred in step T833 transforms the register to its set state. In base 10, for example, this situation would occur when the register one place value higher than the register set in step T831 stores a "9". When this situation occurs, it is necessary to extend the borrowing to the register one step higher in place value than the register set in step T833. The necessary processing steps begin with step T840 which is a reset step of the register set in step T833 in this special case. In step T841, counting register r is incremented by one in anticipation of skipping over the register of memory group b having the place value of the register reset in step T840. The skipping signified by step T841 is necessary because once the corresponding register of memory group a has been transformed to a zero, the corresponding register of memory group b need not be further processed because it is in the state it needs to be in for the final subtraction result. Upon completion of step T841, the method proceeds back to step T832 for another iteration. Step T832 increments counting register s by one to signify the pointing at corresponding registers next highest in place value. In step T833, the register of memory group a being pointed at by counting register s is incremented by one to complete the borrowing process (which is now two digits removed from the digit that predicated the need to borrow). Step T834 is encountered again and provides for further shifting of the digit for which borrowing is effected if necessary through the "yes" conditional. In base 10, repeated shifting of the digit for which borrowing is effected is needed whenever a series of consecutive digits having the value "9" are present in the subtractand a (e.g. when subtractand a in b−a is number such as 29997). Once borrowing has been completed, the method proceeds to step T835 where the counting register s is optionally reset to ready it for service for further borrowing should it be necessary in later iterations.

Upon completion of one of steps T808, T821, or T835, the method continues to step T809 where counting register r is incremented by one to signify or designate the next digit to be processed by the method. In the case of subtraction, it is preferable to process digits in the order of increasing place value so that the initial value of r corresponds to the processing of digits having a place value of "1", the next value of r corresponds to the processing of digits having a place value of "10" etc. Step T810 tests whether the counting register r has reached its final state and routes the method to execute another iteration or to terminate accordingly.

Multiplication

In one embodiment, multiplication may be accomplished through repetitive application of an addition algorithm. This embodiment recognizes that multiplication is nothing more than an addition process repeated multiple times. Multiplying 3 by 5, for example, is equivalent to the addition 3+3+3+3+3; i.e. the addition of five 3's. It may equivalently be viewed as the addition of three 5's (5+5+5). According to this embodiment, multiplication is accomplished by completing an addition process an appropriate number of times. A generalization of this embodiment is readily conceived. A first and a second multiplicative factor are each provided and repeated addition of one of the factors is completed according to the other factor. If the first factor is added repeatedly, the second factor governs the number of times the first factor is added to itself to effect multiplication. Specifically, the number of addition operations is one less than the numerical value of the second factor. From the example above, we may illustrate by letting 3 correspond to a first factor and 5 to a second factor. We thus repeatedly add 3 according to the second factor 5. As indicated hereinabove, the number of addition operations is one less than 5 (note that four addition operations occur in 3+3+3+3+3).

Figure 11:
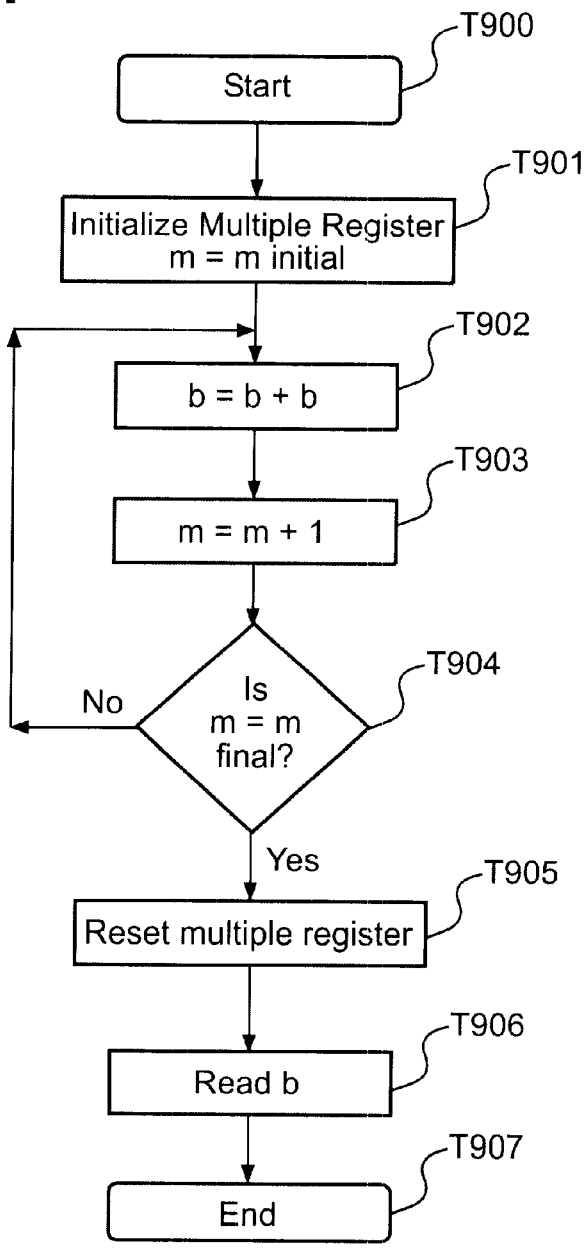
FIG. 11 shows steps in a method of multiplication denoted BASIC MULTIPLY. In this embodiment, the product of numbers in locations a and b is provided.

A method entitled BASIC MULTIPLY(ab;a,b) effecting the preceding embodiment is included in FIG. 11 herein. The method takes factors a and b as input and produces the product ab as output. The method starts at step T900, which may include the storing of the factors a and b in appropriate locations, registers or memory groups of a multistate phase change material. Programming states, programming intervals and assignment of numerical values may also be completed in step T900. Storing may include providing energy sufficient to transform a phase change material to the programming state associated with a number being stored. A multiple register m is initialized in step T901. The purpose of the multiple register is to keep track of the number of times that one of the factors has been added to itself. The number of increments for the multiple register is determined by the factor not being repeatedly added to itself. The index m is used to count multiples and has initial ($m_{initial}$) and final ($m_{final}$) states established so that the number of increments between its initial and final states is one less than the numerical value of the factor not being repeatedly added.

In the embodiment depicted in FIG. 11 herein, the factor b is being repeatedly added in step T902 so that the factor a is used to establish the initial and final states of the multiple register. If the factor a is equal to three, for example, the number of increments separating the initial and final states of the multiple register would be two. In this example, in the iteration corresponding to $m=m_{initial}$, b+b=2b is computed and the multiple register m is incremented in step T903 to $m=m_{initial}+1$. Step T904 queries whether the multiple register m has reached its final state. In this example, further iteration is required. Continuing to the iteration corresponding to $m=m_{initial}+1$, $2b+b=3b$ is computed in step T902 and the multiple register is incremented to $m=m_{initial}+2$ in step T903. Since a=3 in this example, we have obtained the desired product ab=3b and may now proceed to the optional multiple register reset step T905 in which the multiple register is reset to its initial state or to some other desired starting state. Note that the multiple register has been incremented one fewer times than the numerical value of the factor a in this example. If the multiple register is comprised of a phase change material, the initialization step T901 or optional reset step T905 may include a transformation of the multiple register to its reset state followed by further application of energy to establish a desired initial or starting state. In step T906, the memory group or portion of the phase change material in which the factor b was stored and repeatedly added is read to obtain the output product.

In a preferred embodiment, the multiple register is comprised of a phase change material and the state $m_{final}$ corresponds to the set state. In this embodiment, $m_{initial}$ is selected so that the providing of programming pulses or increment intervals numbering one less than the multiplicative factor a in the preceding example causes the multiple register to transform to its set state.

Repeated addition of the factor b in step T902 over many iterations of the method may create a need to carryover. When carryover is necessary, it may be accomplished as described in the ADD method described hereinabove.

BASIC MULTIPLY may be used with single digit or multidigit factors. When the factor b is a multidigit number, the addition step T902 may be accomplished in a register by register fashion over the digits of b. Methods such as ADD or BASIC ADD described hereinabove may be used to complete register by register addition.

If the factor a responsible for establishing the number of repeated additions of the factor b is a very large number, it may exceed the number of programming states available to the multiple register when the multiple register includes a phase change material. Consider the multiplication of b=35 and a=12 in a base 10 system in which the memory elements of memory groups and the multiple register comprise a phase change material having ten programming states corresponding to the digits 0–9. In this example, the factor a=12 is greater than the number of programming states available to a single multiple register. When a situation of this type occurs, multiplication may still be accomplished through repeated addition. It is necessary, however, to properly account for the number of times the addition is repeated by, for example, utilizing a separate multiple register for each digit or place value of the factor a. In the current example where a=12, for example, a first multiple register may be defined for the digit "2" and a second multiple register may be defmed for the digit "1". Such an approach, however, needs to keep track of place value. It must be recognized, for example, that the "1" stored in the second multiple register corresponds to a "10" in the first multiple register.

Several approaches to accounting for place value are possible. In a simple embodiment, a secondary multiple register or secondary multiple group of registers may be established to keep track of the appropriate number of additions for higher place value digits in the multiplicative factor a. In the preceding example where the multiplicative factor a=12, for example, the digit 1 having a place value of ten requires inclusion of nine (10−1) addition steps analogous to step T902. The nine additions may be accounted for by incrementing a secondary multiple register by one for each addition and terminating the additions when the secondary multiple register has been incremented nine times. This procedure may be used as well for any number of required repeated additions for higher place value digits in the multiplicative factor a. In this embodiment, the secondary multiple register or group is incremented by one for each addition and addition terminates when the number stored in the secondary multiple register or group is one less than the multiplicative factor a. The terminating condition may be tested for by comparing the value of the multiplicative factor a with one more than the value stored in the secondary multiple register or group. One way to effect comparison is to increment the memory group storing the multiplicative factor a and the multiple register or group in a one to one fashion where the multiple register or group has been incremented by one prior to initiation of the comparison. When corresponding registers of the memory group storing the multiplicative factor a and the multiple register or group (incremented by one prior to comparison) are transformed to the set state during the same iteration, the correct number of additions has been completed.

Another approach for accounting for place value is shifting. The strategy behind shifting is to increase the place value of the digits of a simple summation determined by a higher place value digit in the multiplicative factor a according to the place value of that digit. In the preceding example of b=35 and a=12, for example, the digit 1 in the multiplicative factor a may be included by taking one multiple of b and then shifting each of its digits one place value higher. One multiple of b gives 35. Shifting one step higher in place value transforms 35 into 350. The net result, 350, represents the contribution of the digit "1" in the multiplicative factor a=12 to the desired multiplication result. By adding 350 (the contribution of the digit "1" in a=12) to 70 (35+35; the contribution of the digit "2" in a=12), we obtain the final multiplication result. The shifting method may be used with any place value digit. The hundreds digit, for example, necessitates upward shifting in place value by two steps in this embodiment. The shifting approach in combination with the BASIC MULTIPLY method depicted in FIG. 11 herein provides for a register by register repeated addition of the multiplicative factor b according to the digits of the multiplicative factor a Repeated addition may be accomplished for each digit of the multiplicative factor a according to BASIC MULTIPLY and shifted according to place value to account for the contribution of each digit of the multiplicative factor a to the desired multiplication result. The desired multiplication result may ultimately be obtained by summing over the contribution of all of the digits of the multiplicative factor a.

Division

In one embodiment, division may be viewed as a process of repeatedly subtracting a divisor from a dividend until the dividend has been reduced to zero or to within one multiple of the divisor of zero. This embodiment is analogous to the repeated addition concept of multiplication described hereinabove. In contrast to repeated addition, repeated subtraction frequently encounters situations where the dividend is not a whole number multiple of the divisor. Only those divisors that are factors of a particular dividend are evenly divisible into that dividend. Repeated subtraction of a divisor that is a factor of a dividend may reduce the dividend to zero. In contrast, repeated subtraction of a divisor that is not a factor of a dividend cannot reduce the dividend to zero. The outcome of the division of a dividend by a divisor that is not a factor consists of a whole number and a remainder, or equivalently, a whole number and a fraction (or decimal equivalent thereof). The division of the dividend 13 by the divisor 3, for example, leads to 4 with a remainder of 1 or to 4 and the fraction ⅓.

Figure 12:
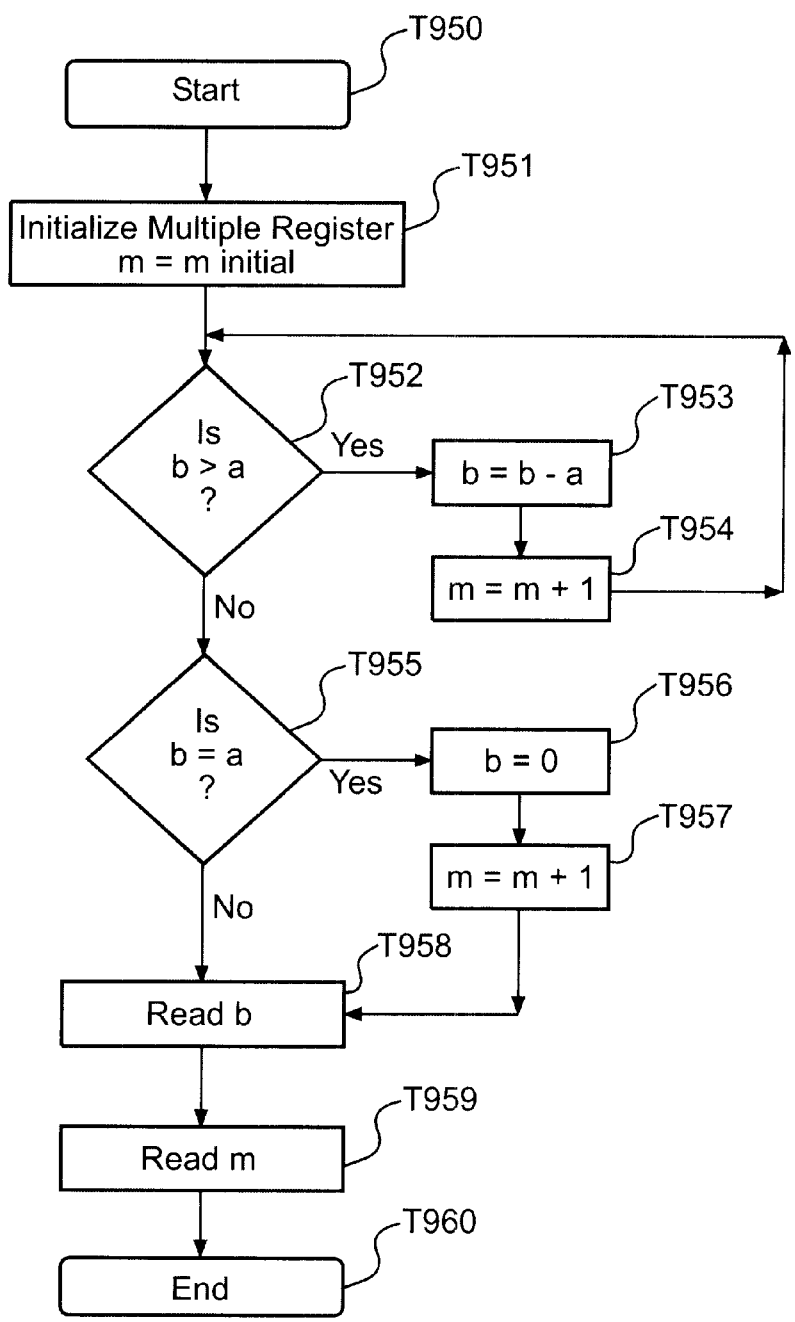
FIG. 12 shows steps in a method of division denoted BASIC DIVIDE. In this embodiment, the quotient of numbers in locations b and a is provided. The quotient includes a multiple of the divisor a and a remainder.

A method BASIC DIVIDE(b/a;a,b) that completes division through repeated subtraction is shown in FIG. 12. The method accepts a dividend b, a divisor a, and provides the division result b/a. The method starts with step T950 which may include storage of the dividend and divisor into memory groups comprising a phase change material. The dividend b is present in or stored into memory group b and the dividend a is present in or stored into memory group a at the start of the method. Programming states, programming intervals and assignment of numerical values may also be completed in step T950. Storing may include providing energy sufficient to transform a phase change material to the programming state associated with a number being stored. A multiple register is initialized in step T951. The purpose of the multiple register is to count the number of times the divisor a is subtracted from the dividend b. Step T952 is a comparison step that determines whether the divisor a is to be subtracted from the dividend b. While the dividend b is greater than the divisor a, further subtraction of a from b is possible without producing a negative number. When the divisor a is subtracted enough times from the dividend b, b becomes less than a. At this point, further subtraction is not desired and the value stored in memory group b corresponds to the remainder portion of the division result.

If b is greater than a, the method proceeds from step T952 to step T953 which executes the subtraction of the divisor a from b. Upon completion of step T953, the value of the divisor a has not been altered, while the value of b has been reduced. In the embodiment of FIG. 12, the subtraction result b−a is completed within memory group b. It is equally viable to complete the subtraction in another memory group while retaining the original value of b in memory group b. The subtraction of step T953 may be accomplished using methods such as BASIC SUBTRACT and SUBTRACT described hereinabove, or equivalents thereof. Upon completion of step T953, the method proceeds to step T954 where the multiple register is incremented by one to signify completion of one subtraction of a from b. The method returns to step T952 and again tests whether b is greater than a. If b is greater than a, the method repeats steps T953 and T954.

Iteration through steps T953 and T954 continues until b is no longer greater than a. At this point in the computation, the method proceeds from step T952 to step T955 to test whether b=a. If b=a, the divisor a is a factor of the original dividend and the method proceeds to step T956 where b is set equal to zero. Step T956 may be accomplished by directly setting memory group b to zero or by executing b−a one further time. Upon completion of step T956, the method proceeds to step T957 where the multiple register is incremented by one and then to step T958. The method also proceeds to step T958 if b is found to be not equal to a in step T955. In step T958, the current value stored in memory group b is determined. Upon creation of the condition b<a by repeated subtraction of a from b, the value stored in memory group b corresponds to the remainder of the desired division result. If the divisor a is found to be a factor of the original dividend, the value of b determined in step T958 would be zero. Step T959 determines the final value of the multiple register m. This value provides the number of times that the divisor has been subtracted from the original dividend b and when combined with the remainder, provides a solution to the division problem b/a If the initial value of the multiple register $m_{initial}$ is zero, the final value of m determined in step T959 directly provides the number of multiples of the divisor contained in the original dividend b. If the initial value of m is not zero, the difference between the initial and final value of m provides the number of multiples of the divisor contained in the original dividend b. In a preferred embodiment, $m_{initial}$ is zero.

The comparison step T952 may be accomplished in several ways. A simple comparison test would be to compare the number of leading zeroes present in memory group b with the number of leading zeroes present in memory group a. If memory group a contains more leading zeroes than memory group b, the value stored in memory group b is greater than the value stored in memory group a and the method should proceed to step T953. The number of leading zeroes may be determined by reading the individual registers of memory groups a and b and testing for the presence of a zero. Preferably, reading of the registers proceeds in order of decreasing register place value. Once a non-leading zero digit is encountered, the number of leading zeroes is readily determined. If the set state is chosen to correspond to zero, the reading of registers may be accomplished through a simple resistance measurement. If the reset state is chosen as zero, the registers must be incremented to the set state. If the number of programming pulses or increment intervals corresponds to the maximum number possible for the register, it is concluded that the register was initially present in the reset state and stored a zero.

When the number of leading zeros present in memory groups b and a is the same, or if an alternative method of comparison is preferred, it is also possible to implement a direct comparison of the values present in memory groups b and a One direct comparison method includes incrementing memory groups b and a in a one-to-one fashion until one of the two memory groups is transformed to its set state. The memory group that first transforms to its set state upon simultaneous incrementing corresponds to the memory group that stores the larger number. If memory group b stored a 7 and memory group a stored a 4, for example, memory group b would be transformed to its set state first upon simultaneous incrementing and, of course, corresponds to the larger number. An analogous test can be devised where memory groups b and a include non-zero digits in two or more registers.

It is preferable to initiate the comparison at the register having the highest place value that does not store a zero. If, in this preferred embodiment, memory groups b and a contain a different number of registers storing non-leading zero digits, the test of a single register permits determination of whether b is greater than a. When memory groups b and a include the same number of leading zero registers, comparison of the non-leading zero registers of memory groups a and b having the highest place value permits determination of whether b is greater than a provided that the highest place value digits of the numbers stored in memory groups a and b have unequal numerical values. If they have equal values, the comparison test continues to the registers of memory groups a and b having the next highest place value and is repeated until a determination of whether memory group a or b stores the greatest numerical value. This procedure may also be used to determine whether b is equal to a. If all corresponding digits of the numbers stored in memory groups a and b are equal, then b=a and the condition of step T955 is satisfied.

The disclosure set forth herein is illustrative and not intended to limit the practice of the instant invention. Numerous equivalents and variations thereof, including obvious interchanges of the order of some of the steps in the disclosed computing methods, are envisioned to be within the scope of the instant invention. It is the following claims, including all equivalents, in combination with the foregoing disclosure, which define the scope of the instant invention.

We claim:

1. A method of computing comprising the steps of:
providing a memory group, said memory group having one or more registers, said registers comprising a digital multistate phase change material, said phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;
performing a mathematical operation selected from the group consisting of addition, subtraction, multiplication, and division by providing energy to said one or more registers so as to effect transformations of said registers among one or more of said plurality of states.

2. The method of claim 1, wherein said mathematical operation is selected from the group consisting of subtraction, multiplication, and division.

3. The method of claim 1, wherein said mathematical operation is completed in a non-binary fashion.

4. The method of claim 1, wherein said phase change material comprises one or more elements selected from the group consisting of In, Ag, Te, Se, Ge, Sb, Bi, Pb, Sn, As, S, Si, P, O and mixtures or alloys thereof.

5. The method of claim 1, wherein said phase change material comprises Ge and a chalcogen element.

6. The method of claim 5, wherein said phase change material further comprises Sb.

7. The method of claim 1, wherein said phase change material comprises at least one chalcogen element and at least one transition metal element.

8. The method of claim 7, wherein said at least one chalcogen is a mixture of both Te and Se.

9. The method of claim 7, wherein said at least one transition metal element is selected from the group consisting of Cr, Fe, Ni, Nb, Pd, Pt and mixtures or alloys thereof.

10. The method of claim 1, wherein said phase change material has one or more programming states selected from said plurality of states, said programming states having numerical values assigned thereto, each of said programming states being obtainable from said reset state by the application of programming energy in an amount not exceeding said set energy, said programming energy being representative of the numerical value associated with the programming state corresponding to said programming energy.

11. The method of claim 10, wherein said performing step includes storing one or more numbers in said phase change material, said storing including transforming one or more portions of said phase change material to the programming states associated with said one or more numbers.

12. The method of claim 10, wherein said programming states include at least one of said one or more intermediate states.

13. The method of claim 10, wherein said programming states include said reset state.

14. The method of claim 13, wherein the numerical value assigned to said reset state is zero.

15. The method of claim 10, wherein said programming states include said set state.

16. The method of claim 15, wherein the numerical value assigned to said set state is zero.

17. The method of claim 10, wherein the programming energy of each of said programming states is proportional to the numerical value assigned to said programming state.

18. The method of claim 10, wherein said programming states are equally separated in energy.

19. The method of claim 10, wherein said numerical values are consecutive integers.

20. The method of claim 19, wherein said consecutive integers are associated with said programming states in increasing order of programming energy.

21. The method of claim 10, wherein said energy provided in said performing step includes the energy necessary to transform said phase change material from one of said programming states to another of said programming states.

22. The method of claim 1, wherein said energy provided in said performing step is provided in the form of electrical energy.

23. The method of claim 22, wherein said electrical energy is in the form of one or more electric current pulses.

24. The method of claim 23, wherein said one or more electric current pulses are isoenergetic.

25. The method of claim 1, wherein said performing step includes the storage of a number in said phase change material.

26. The method of claim 25, wherein each of said registers of said memory group corresponds to a different place value.

27. The method of claim 26, wherein each digit of said number is stored in the register of said memory group corresponding in place value to said digit.

28. The method of claim 1, wherein said performing step includes the storage of a plurality of numbers in said phase change material.

29. A method of addition comprising the steps of:
providing a digital multi-state phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;
storing a first number in a first portion of said phase change material, said storing a first number including providing energy characteristic of said first number to said first portion of said phase change material,
providing energy characteristic of a second number to said phase change material.

30. The method of claim 29, wherein said storing step includes providing energy corresponding to said first number to the reset state of said first portion of said phase change material.

31. The method of claim 30, wherein said energy corresponding to said first number is proportional to the numerical value of said first number.

32. The method of claim 29, wherein said providing energy characteristic of a second number step includes providing energy corresponding to said second number to the reset state of said phase change material.

33. The method of claim 32, wherein said energy corresponding to said second number is proportional to the numerical value of said second number.

34. The method of claim 29, wherein said energy characteristic of said second number is provided to said first portion of said phase change material.

35. A method of addition comprising the steps of:
providing a digital multistate phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;
defining programming states for said phase change material, said programming states being selected from said plurality of states, said programming states having programming energies, said programming energies corresponding to the amount of energy required to transform said phase change material from its reset state to said programming states; said programming energies not exceeding said set energy of said reset state;
assigning numerical values to said programming states;
storing a first number in a first portion of said phase change material, said storing a first number including providing energy in an amount sufficient to transform said first portion of said phase change material to the programming state associated with the numerical value of said first number;
providing energy characteristic of a second number to said phase change material.

36. The method of claim 35, wherein said numerical values increase as the programming energies of said programming states increase.

37. The method of claim 35, wherein said numerical values are proportional to the programming energies of said programming states.

38. The method of claim 35, wherein said numerical values are consecutive integers beginning with zero.

39. The method of claim 35, wherein the numerical value zero is assigned to said set state of said phase change material.

40. The method of claim 35, wherein said energy characteristic of said second number is the energy required to transform said phase change material to the programming state associated with the numerical value of said second number.

41. The method of claim 35, wherein said providing energy characteristic of said second number step includes storing said second number in a second portion of said phase change material, said storing including transforming said second portion of said phase change material to the programming state associated with the numerical value of said second number.

42. The method of claim 41, further comprising the steps of:
providing a first set energy to said first portion of said phase change material, said first set energy effecting a transformation of said first portion of said phase change material from the programming state associated with the numerical value of said first number to its set state;
providing said first set energy to the reset state of a third portion of said phase change material;
providing a second set energy to said third portion of said phase change material, said second set energy effecting a transformation of said third portion of said phase change material to its set state;
providing said second set energy to said second portion of said phase change material.

43. A method of addition comprising the steps of:
providing a digital multistate phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;
partitioning at least a portion of said phase change material into memory groups, each of said memory groups corresponding to the volume of said phase change material allocated for the purpose of storing a multidigit number;
dividing said memory groups into a plurality of registers, said registers corresponding to the portion of said memory group allocated for the purpose of storing a digit of said multidigit number, said registers having programming states, said programming states being selected from said plurality of states of said phase change material, said programming states having programming energies, said programming energies corresponding to the amounts of energy required to transform said phase change material from its reset state to said programming states; said programming energies not exceeding said set energy of said reset state;
assigning numerical values to said programming states;
associating place values with the registers of said memory groups, each of said memory groups including the same place values;
writing a first multidigit number to a first memory group, said writing including storing the digits of said multidigit number in the registers of said first memory group according to place value, said storing including transforming said registers to the programming states associated with the numerical values of said digits;
providing energy characteristic of a second number to said phase change material.

44. The method of claim 43, wherein said providing energy step includes providing energy characteristic of each of the digits of said second number to the appropriate register of said first memory group, said appropriate register being the register corresponding in place value to said digit of said second number.

45. The method of claim 43, wherein said providing energy step includes writing said second number to a second memory group, said writing including storing the digits of said second number in separate registers of said second memory group, each of said separate registers corresponding to digits having different place value, said storing including transforming said registers to the programming states associated with the numerical values of said digits.

46. The method of claim 45, further comprising the steps of
establishing a counter for pointing at the registers of one or more memory groups, said counter having counter values, said counter values corresponding to counter programming states;

associating each register of said first memory group in which a digit is stored with one of a consecutive set of said counter programming states;

associating each register of said second memory group with the counter programming state to which the register of said first memory group having the same place value is associated;

associating each register of a third memory group with the counter programming state to which the register of said first memory group having the same place value is associated;

initializing said counter to an initial counter value, said initial counter value corresponding to an initial counter programming state, said initial counter programming state corresponding to the counter programming state within said set of consecutive programming states having the lowest counter value;

while said counter has a counter value within said set of consecutive counter values, iteratively performing the following steps a–e:

a. providing a first set energy to the register of said first memory group being pointed at by said counter, said register of said first memory group being pointed at corresponding to the register of said first memory group associated with the value of said counter, said first set energy transforming said register of said first memory group being pointed at to its set state;

b. providing said first set energy to the reset state of the register of said third memory group being pointed at by said counter, said register of said third memory group being pointed at corresponding to the register of said third memory group associated with the value of said counter;

c. providing a second set energy to said register of said third memory group being pointed at, said second set energy transforming said register of said third memory group being pointed at to its set state;

d. providing said second set energy to the register of said second memory group being pointed at by said counter, said register of said second memory group being pointed at corresponding to the register of said second memory group associated with the value of said counter;

e. incrementing the value of said counter.

47. The method of claim 46, wherein said counter is comprised of said phase change material.

48. The method of claim 47, wherein said counter programming states are selected from said plurality of states of said phase change material.

49. The method of claim 48, wherein the counter programming state upon conclusion of said iterative steps a–e is the set state of said phase change material.

50. The method of claim 46, wherein the number of counter programming states is the same as the number of programming states of said registers.

51. A method of subtraction comprising the steps of:

providing a digital multi-state phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;

storing a first number in a first volume of said phase change material, said storing a first number including providing energy characteristic of said first number to the reset state of said first volume of said phase change material, said energy characteristic of said first number not exceeding said set energy of said reset state;

storing a second number in a second volume of said phase change material, said storing a second number including providing energy characteristic of said second number to the reset state of said second volume of said phase change material, said energy characteristic of said second number not exceeding said set energy of said reset state;.

providing a first set energy to said first volume of said phase change material, said first set energy transforming said first volume of said phase change material to its set state;

providing said first set energy to said second volume of said phase change material.

52. The method of claim 51, wherein said energy characteristic of said first number is proportional to said first number and said energy characteristic of said second number is proportional to said second number.

53. The method of claim 51, wherein said providing said first set energy to said second volume step comprises the steps of:

providing a first portion of said first set energy to said second volume of said phase change material, said first portion being sufficient to transform said second volume to its set state;

resetting said second volume;

providing the balance of said first set energy to said second volume.

54. The method of claim 51, further comprising the steps of:

defining programming states for said phase change material, said programming states being selected from said plurality of states, said programming states having programming energies, said programming energies corresponding to the amount of energy required to transform said phase change material from its reset state to said programming states, said programming energies not exceeding said set energy of said reset state;

assigning numerical values to said programming states.

55. The method of claim 54, wherein said storing a first number step includes providing energy in an amount sufficient to transform said first volume of said phase change material to the programming state associated with the numerical value of said first number.

56. The method of claim 54, wherein said storing a second number step includes providing energy in an amount sufficient to transform said second volume of said phase change material to the programming state associated with the numerical value of said second number.

57. A method of multiplying a first number with a second number comprising the steps of:

providing a digital multi-state phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;

storing said first number in a first portion of said phase change material;

setting a multiple register to an initial value;

for values of the multiple register less than the sum of said initial value and said second number, performing the following steps a–b:
  a. adding said first number to the number stored in said first portion of said phase change material, said adding including providing energy characteristic of said first number to said first portion of said phase change material;
  b. incrementing said multiple register;

reading the value stored in said first portion of said phase change material.

58. The method of claim 57, further comprising the steps of:

defining programming states for said phase change material, said programming states being selected from said plurality of states, said programming states having programming energies, said programming energies corresponding to the amount of energy required to transform said phase change material from its reset state to said programming states, said programming energies not exceeding said set energy of said reset state;

assigning numerical values to said programming states.

59. The method of claim 58, wherein said storing step includes providing energy in an amount sufficient to transform said first portion of said phase change material to the programming state associated with said first number.

60. The method of claim 58, wherein said energy characteristic of said first number is the energy required to transform said phase change material from its reset state to the programming state associated with said first number.

61. The method of claim 57, wherein said multiple register comprises a second portion of said phase change material.

62. A method of dividing a first number by a second number comprising the steps of:

providing a digital multi-state phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;

storing said first number in said phase change material;

setting a multiple register to an initial value;

while the number stored in said phase change material is greater than or equal to said second number, iteratively performing the following steps a–b:

a. subtracting said second number from said number stored in said phase change material, said subtracting including providing energy to transform said phase change material to a state corresponding to the difference between said stored number and said second number;
  b. incrementing said multiple register;

reading the number stored in said phase change material;

reading the value of said multiple register.

63. The method of claim 62, further comprising the steps of:

defining programming states for said phase change material, said programming states being selected from said plurality of states, said programming states having programming energies, said programming energies corresponding to the amount of energy required to transform said phase change material from its reset state to said programming states, said programming energies not exceeding said set energy of said reset state;

assigning numerical values to said programming states.

64. The method of claim 63, wherein said storing step includes providing energy in an amount sufficient to transform said first portion of said phase change material to the programming state associated with said first number.

65. The method of claim 63, wherein said energy characteristic of said first number is the energy required to transform said phase change material from its reset state to the programming state associated with said first number.

66. The method of claim 62, wherein said multiple register comprises a second portion of said phase change material.

67. A method of computing the complement of a number comprising the steps of:

providing a digital multi-state phase change material having a plurality of states, said states including: a reset state, a set state obtainable from said reset state by applying energy in an amount corresponding to the set energy of said reset state, said set state having lower resistance than said reset state, and one or more intermediate states having substantially the same resistance as said reset state, said one or more intermediate states being obtainable from said reset state by applying energy in an amount less than said set energy of said reset state;

storing a number in a first portion of said phase change material, said storing including providing energy corresponding to said number to the reset state of said phase change material; said corresponding energy not exceeding said set energy of said reset state;

providing setting energy to said first portion of said phase change material, said setting energy transforming said first portion of said phase change material to its set state;

providing said setting energy to a second portion of said phase change material.

* * * * *